United States Patent
Digonnet et al.

(10) Patent No.: US 7,064,889 B2
(45) Date of Patent: Jun. 20, 2006

(54) DOUBLE-CLAD FIBER LASERS AND AMPLIFIERS HAVING LONG-PERIOD FIBER GRATINGS

(75) Inventors: Michel J. F. Digonnet, Palo Alto, CA (US); Vinayak Dangui, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 236 days.

(21) Appl. No.: 10/441,152

(22) Filed: May 19, 2003

(65) Prior Publication Data

US 2004/0036955 A1    Feb. 26, 2004

Related U.S. Application Data

(60) Provisional application No. 60/384,146, filed on May 29, 2002, provisional application No. 60/381,729, filed on May 17, 2002.

(51) Int. Cl.
*H01S 3/00* (2006.01)
*G02B 6/02* (2006.01)

(52) U.S. Cl. .................. 359/341.1; 385/126; 385/127

(58) Field of Classification Search ............. 359/341.1; 385/126, 127
See application file for complete search history.

(56) References Cited

U.S. PATENT DOCUMENTS

| | | | |
|---|---|---|---|
| 5,920,582 A * | 7/1999 | Byron ........................... 372/6 |
| 6,282,341 B1 | 8/2001 | Digonnet et al. ............. 385/37 |
| 6,301,408 B1 * | 10/2001 | Espindola et al. ............ 385/37 |
| 6,427,040 B1 * | 7/2002 | Ahuja et al. .................. 385/37 |
| 6,463,684 B1 * | 10/2002 | Jang .............................. 38/37 |
| 6,487,340 B1 * | 11/2002 | Enomoto et al. ............. 385/37 |
| 6,490,078 B1 * | 12/2002 | Enomoto et al. ......... 359/341.1 |
| 2002/0105997 A1 * | 8/2002 | Zhang .......................... 372/70 |
| 2002/0172459 A1 * | 11/2002 | Bailey et al. ................. 385/31 |

FOREIGN PATENT DOCUMENTS

| | | |
|---|---|---|
| EP | 1 137 127 A2 | 9/2001 |
| JP | 2002107555 | 4/2002 |

OTHER PUBLICATIONS

Saleh et al. *Fundamentals of Photonics*. John Wiley & Sons. 1991. p. 288.*

E. Snitzer et al., *Observed dielectric waveguide modes in the visible spectrum*, Journal of Optical Society of America, vol. 51, No. 5, May 1961, pp. 499-505.

(Continued)

*Primary Examiner*—Deandra M. Hughes
(74) *Attorney, Agent, or Firm*—Knobbe, Martens, Olson & Bear, LLP

(57) ABSTRACT

Long-period fiber gratings are placed in a predetermined pattern along a double-clad optical fiber having an outer cladding, an inner cladding and a core. The core is doped with an optically active material such as, for example, a rare earth ion or other laser ion. The long-period fiber gratings couple light between a mode of the inner cladding and a mode of the core. As a consequence of increased coupling into the core resulting from the use of long-period fiber gratings, the length of double-clad optical fiber needed to transfer light between the inner cladding and the core is reduced.

43 Claims, 20 Drawing Sheets

OTHER PUBLICATIONS

D. Gloge, *Optical power flow in multimode fibers*, Bell System Technical Journal, vol. 51, No. 8, Oct. 1972, pp. 1767-1783.

E. Snitzer et al., *Double-clad, offset core Nd fiber laser*, Proceedings of Conference on Optical Fiber Sensors, Postdeadline paper PD5, 1988.

H. Po et al., *Double-clad high brightness Nd fiber laser pumped by GaA/As phased array*, Proceedings of Optical Fiber Communication '89, Postdeadline paper PD7, 1989, 4 pages.

H. Po et al., *High power neodymium-doped single transverse mode fibre laser*, Electronics Letters, vol. 29, No. 17, Aug. 19, 1993, pp. 1500-1501.

Luis Zenteno, *High-power double-clad fiber lasers*, Journal of Lightwave Technology, vol. 11, No. 9, Sep. 1993, pp. 1435-1446.

Luis A. Zenteno, *Design of a device for pumping a double-clad fiber laser with a laser-diode bar*, Applied Optics, vol. 33, No. 31, Nov. 1, 1994, pp. 7282-7287.

Th. Weber et al., *Cladding-pumped fiber laser*, IEEE Journal of Quantum Electronics, vol. 31, No. 2, Feb. 1995, pp. 326-329.

Th. Weber et al., *A longitudinal and side-pumped single transverse mode double-clad fiber laser with a special silicone coating*, Optics Communication, vol. 115, No. 1-2, Mar. 1995, pp. 99-104.

H. Zellmer et al., *High-power cw neodymium-doped fiber laser operating at 9.2 W with high beam quality*, Optics Letters, vol. 20, No. 6, Mar. 15, 1995, pp. 578-580.

V.P. Gapontsev et al., *25 kW peak power, wide-tunable-repetition-rate and pulse duration eye safe MOPFA laser*, Proceedings of Conference on Lasers and Electro-Optics, CLEO'96, vol. 9, Paper CTuU3, 1996, pp. 209-210.

A, Tünnermann, *High-power Nd double-clad fiber lasers*, Proceedings of Conference on Lasers and Electro-Optics, CLEO'96, Paper CFJ1, 1996, p. 528.

Anping Liu et al., *The absorption charcteristics of rare earth doped circular double-clad fibers*, Optical Review, vol. 3, No. 4, Jul.-Aug. 1996, pp. 276-281. (Abstract Only).

Th. Weber et al., *Side-pumped fiber laser*, Applied Physics B, vol. 63, No. 2, Aug. 1996, pp. 131-134.

Ch. Ghisler et al., *Cladding-pumping of a $Tm^{3+}:Ho^{3+}$ silica fibre laser*, Optics Communication, vol. 132, No. 5-6, Dec. 15, 1996, pp. 474-478.

Anping Liu et al., *The absorption characteristics of circular, offset, and rectangular double-clad fibers*, Optics Communications, vol. 132, No. 5-6, Dec. 15, 1996, pp. 511-518.

H. Zellmer et al., *Double-clad fiber laser with 30 W output power*, Proceedings of Optical Amplifiers and their Applications, OSA Trends in Optics and Photonics Series, vol. 16, Jul. 1997, pp. 137-140.

Turan Erdogan, *Cladding-mode resonances in short- and long-period fiber grating filters*, Journal of the Optical Society of America A, vol. 14, No. 8, Aug. 1997, pp. 1760-1773.

L. Goldberg et al., *V-groove side-pumped 1.5 µm fibre amplifier*, Electronics Letters, vol. 33, No. 25, Dec. 4, 1997, pp. 2127-2129.

V. Reichel et al., *High-power single-mode Nd-doped fiber-laser*, in Solid State Lasers VII, Proceedings of SPIE, vol. 3265, 1998, pp. 192-199.

Martin E. Fermann, *Single-mode excitation of multimode fibers with ultrashort pulses*, Optics Letters, vol. 23, No. 1, Jan. 1, 1998, pp. 52-54.

David J. DiGiovanni et al., *High-power fiber lasers*, Optics and Photonics News, vol. 10, No. 1, Jan. 1999, pp. 26-30.

V. Dominic et al., 110 W fibre laser, Electronics Letters, vol. 35, No. 14, Jul. 8, 1999, pp. 1158-1160.

Tae-Jung Eom et al., *Novel optical fiber connector using long-period fiber gratings*, Proceedings of SPIE, vol. 4638, 2000, pp. 99-106.

Copy of International Search Report mailed on Nov. 5, 2003, in Applicants' corresponding International Application No. PCT/US03/15805 (4 pages).

\* cited by examiner

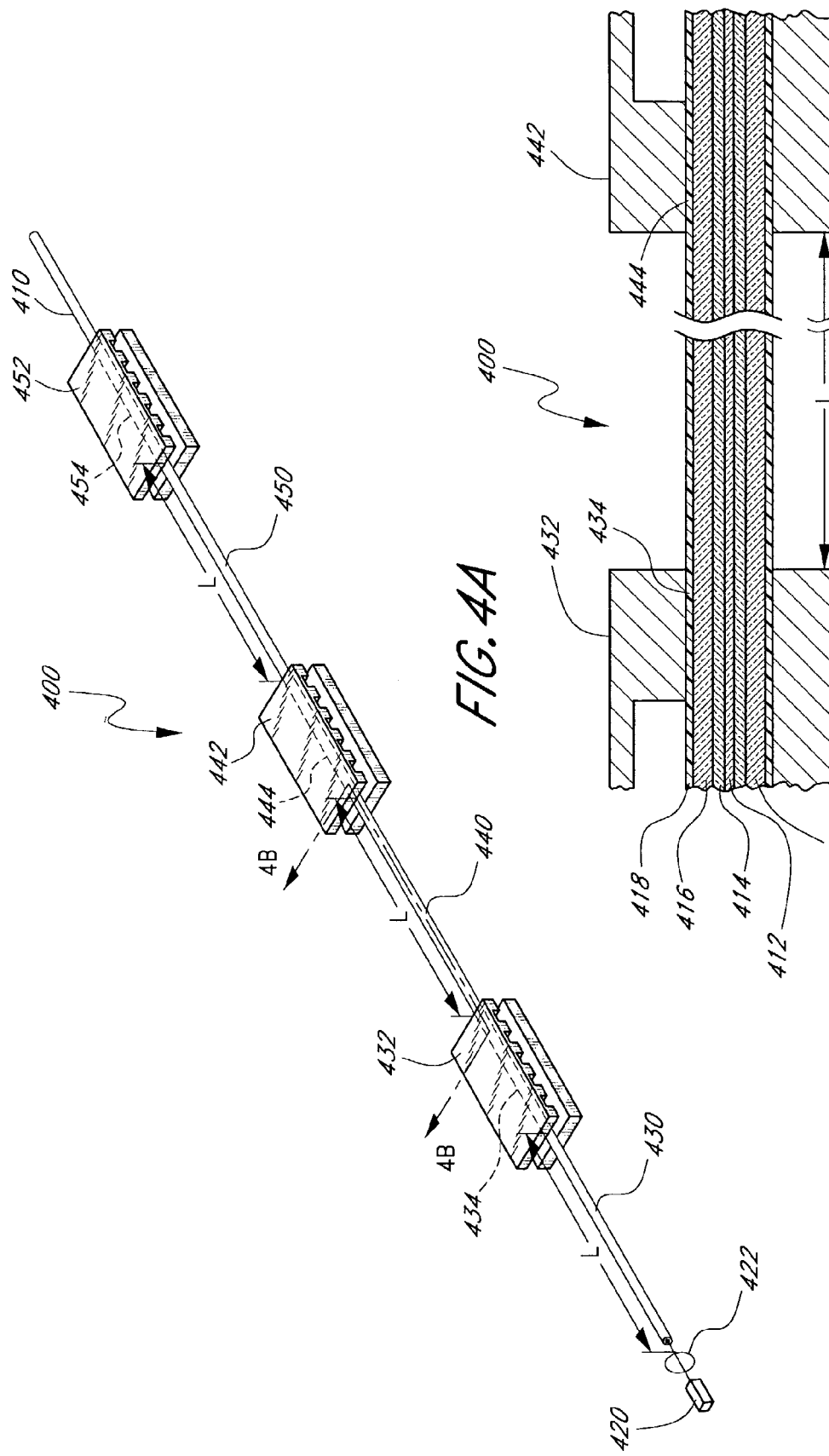

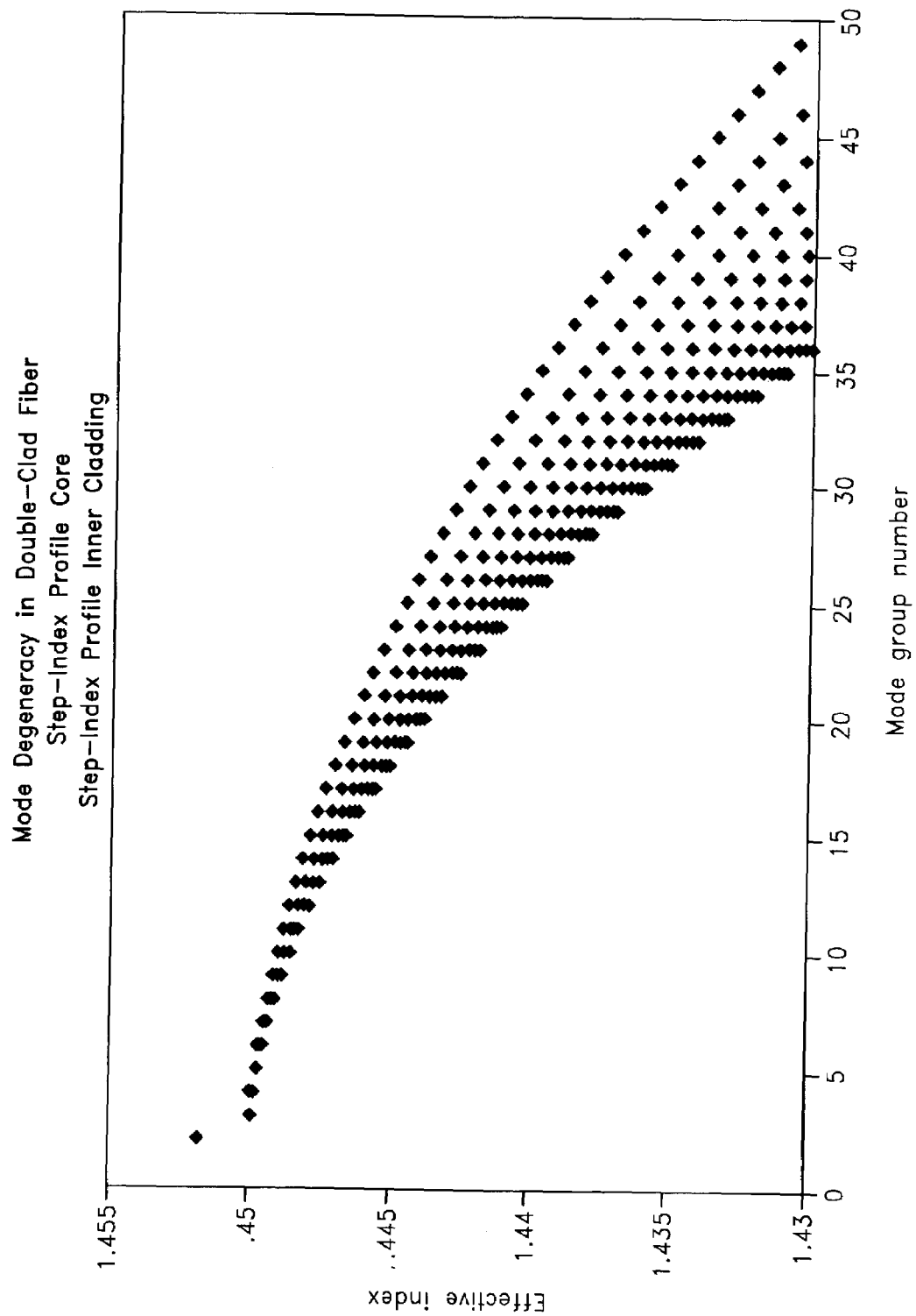

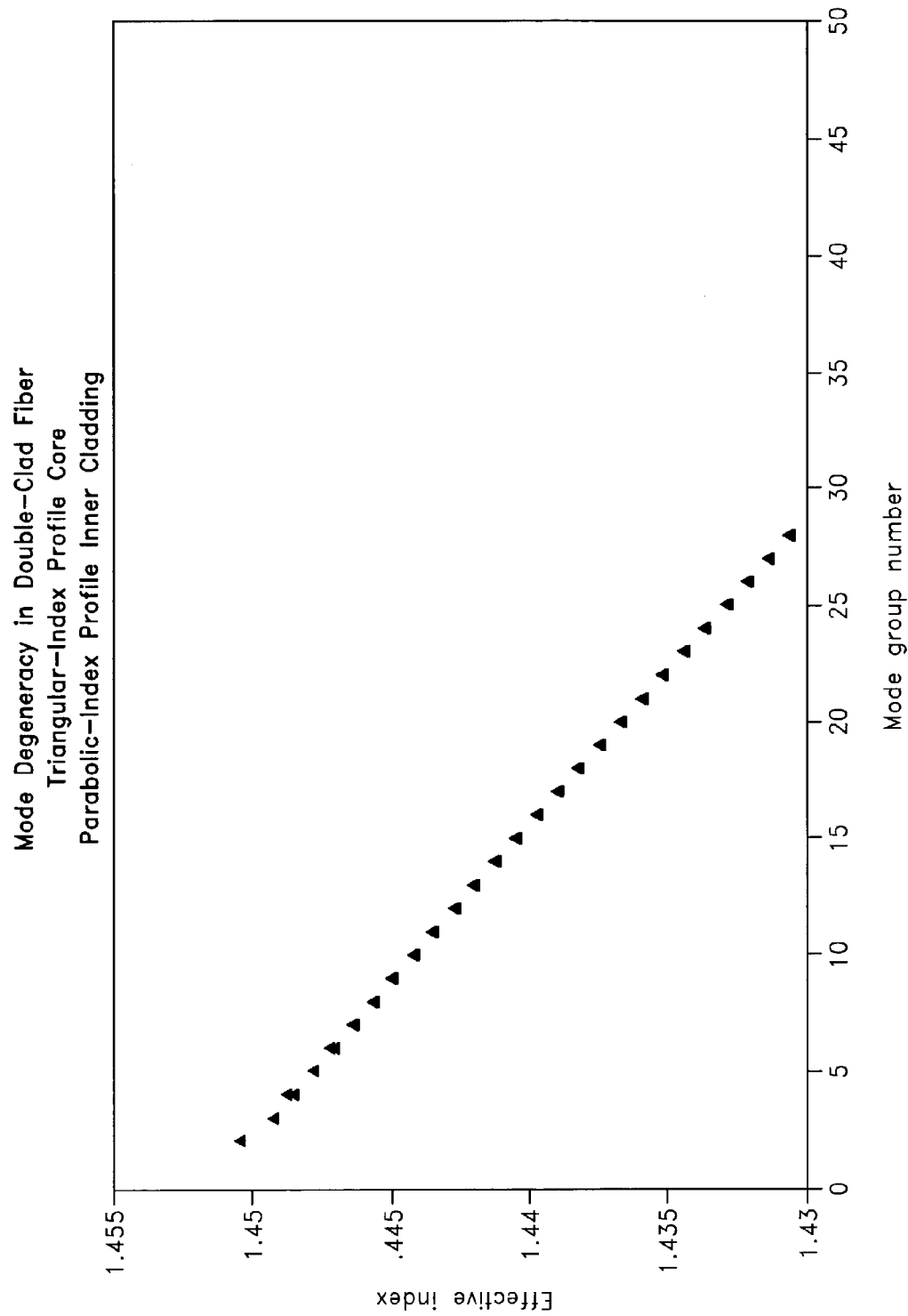

DOUBLE-CLAD FIBER LASERS AND AMPLIFIERS HAVING LONG-PERIOD FIBER GRATINGS

RELATED APPLICATIONS

This application claims the benefit of priority under 35 U.S.C. § 119(e) from U.S. Provisional Patent Application No. 60/381,729, filed on May 17, 2002, and from U.S. Provisional Patent Application No. 60/384,146, filed on May 29, 2002, which are incorporated by reference herein.

BACKGROUND OF THE INVENTION

1. Field of the Invention

The present invention is in the field of optical fiber systems, and, more particularly, is in the field of optical fiber lasers and optical fiber amplifiers.

2. Description of the Related Art

Silica-based fibers are excellent media for high-power lasers for two basic reasons. Silica-based fibers exhibit an extremely high optical damage threshold. Silica-based fibers have a high surface-to-volume ratio, which makes heat dissipation very effective. However, in a conventional fiber laser pumped with a laser diode, the pump light is coupled into the fiber core, which imposes a major limitation on the maximum pump power that can be launched into the fiber. The limitation arises because efficient coupling of the laser diode output into the single-mode fiber core requires the use of a single-mode laser diode. The output power of such pump sources is currently limited to a fraction of a watt by the damage threshold of the semiconductor material in the laser diode. The limit of the pump output power significantly limits the maximum output power of the fiber laser.

The maximum output power of the fiber laser is also limited by the efficiency with which the beam of a laser diode can be coupled into a fiber core. This efficiency is typically about 60% or less because of astigmatism of the laser diode beam. Thus, only a fraction of the available pump power is usable. Since the power conversion of the fiber laser is lower than unity, the brightness of such a fiber laser is typically lower than that of the pump source.

A solution to this problem is to use a double-clad fiber as described, for example, in E. Snitzer et al., *Double-clad, offset core Nd fiber laser*, Proceedings of Conference on Optical Fiber Sensors, Postdeadline paper PD5, 1988. A double-clad fiber comprises a single-mode core doped with a laser ion. The core is surrounded by a first (or inner) cladding of lower refractive index. The inner cladding is surrounded by a second (or outer) cladding of still lower index. The inner cladding thus forms a second, highly multimoded waveguide. The two claddings generally do not contain laser ions.

A double-clad fiber is advantageous because a large amount of pump power (up to 100 s of watts) from low-spatial-coherence, high-power laser diode pumps can be efficiently coupled into the inner cladding because the inner cladding has a large area and a high numerical aperture (NA) approximately matched to the emitting area and the numerical aperture of the pump source (or of the multimode fiber that delivers the pump power, in the case of a fiber-pigtailed laser diode). Another advantage of the double-clad fiber is that the alignment tolerance in coupling to the large-area inner cladding is typically tens of microns rather than the sub-micron tolerance for coupling into a single-mode fiber core. See, for example, Th. Weber et al., *Cladding-pumped fiber laser*, IEEE Journal of Quantum Electronics, Vol. 31, No. 2, February 1995, pages 326–329.

Double-clad fibers have been used since their inception to produce lasers with several rare-earth ions, including, for example, $Nd^{3+}$, $Yb^{3+}$, and $Tm^{3+}$ included in the core. Reports indicate rapidly increasing fiber laser output powers, from the original tens of milliwatts to a recently reported 110 watts in a Yb-doped fiber laser. See, for example, V. Dominic et al., *110 W fibre laser*, Electronics Letters, Vol. 35, No. 14, July 1999, pages 1158–1160. Double-clad fiber lasers with output powers in the 10-watt to 20-watt range have already reached the commercial market and are finding practical applications.

Increasing the pump absorption in a double-clad fiber generally requires an increase in fiber length which may result in increased loss at the laser and pump wavelengths and reduced fiber laser output. Since the spatial overlap between the pump cladding modes and the dopant distribution in the core is relatively small, the pump power absorbed per unit length is reduced compared to a core-pumped fiber, and a longer fiber is required to excite the same total number of dopant ions. Typically, the length increase is ten-fold or more. In a four-level transition (where ground-state absorption (GSA) is non-existent), this length increase results in a negligible increase in the laser absorption loss and therefore a negligible change in the threshold. These points are illustrated by an experimental study of the dependence of the threshold and slope efficiency on fiber length in a double-clad Nd-doped fiber laser, as described, for example, in Th. Weber et al., *Cladding-pumped fiber laser* (cited above). However, GSA is substantial in a three-level transition. Thus, the fiber length increase results in a large increase in signal absorption loss and threshold. Double-clad fibers are in general not as effective for three-level transitions.

A large body of literature now exists on the theoretical investigations and design of double-clad fiber profiles to optimize power transfer per unit length from the pump cladding modes to the dopant. See, for example, L. Zenteno, *High-power double-clad fiber lasers*, Journal of Lightwave Technology, Vol. 11, No. 9, September 1993, pages 1435–1446; and V. Reichel et al., *High-power single-mode Nd-doped fiber-laser*, in Solid State Lasers VII, Proceedings of SPIE, Vol. 3265, 1998, pages 192–199. One difficulty encountered with respect to double-clad fiber is that only the $HE_{1m}$ family of modes have intensity at the center of a fiber when the inner cladding has a circular cross section. Since most of the pump is launched as helical rays, most of the pump power misses the core. See, for example, E. Snitzer et al., *Observed dielectric waveguide modes in the visible spectrum*, Journal of Optical Society of America, Vol. 51, No. 5, May 1961, pages 499–505.

One solution for increasing the pump power transfer efficiency offsets the core from the center of the inner cladding, as described, for example, in E. Snitzer et al., *Double-clad, offset core Nd fiber laser* (cited above) and in H. Po et al., *Double-clad high brightness Nd fiber laser pumped by GaAlAs phased array*, Proceedings of Optical Fiber Communication '89, Postdeadline paper PD7, 1989. In one measurement involving an Nd-doped fiber, the pump absorption when the core was centered on the cladding was only 5% of what it would be if the same amount of dopant was uniformly distributed across the inner cladding. By offsetting the core to near the edge of the inner cladding, the pump absorption increased to 28%, as described, for example, in H. Po et al., *Double-clad high brightness Nd fiber laser pumped by GaAlAs phased array* (cited above).

Another solution for increasing the pump power transfer efficiency alters the shape of the inner cladding to support modes that fill the multimode cladding. For example, rectangular claddings, D-shaped claddings, and scalloped claddings have been proposed and evaluated in A. Liu et al., *The absorption characteristics of circular, offset, and rectangular double-clad fibers*, Optics Communications, Vol. 132, No. 5–6, December 1996, pages 511–518, in V. Reichel et al., *High-power single-mode Nd-doped fiber-laser*, (cited above), and in D. J. DiGiovanni et al., *High-power fiber lasers*, Optics and Photonics News, Vol. 10, No. 1, January 1999, pages 26–30.

In a D-shaped cladding, the helical rays are coupled to the meridional rays and all pump rays pass through the core, as illustrated, for example, in V. Reichel et al., *High-power single-mode Nd-doped fiber-laser* (cited above). It was pointed out early that a rectangular shape is particularly attractive because it matches the output pattern of a multiple-stripe laser diodes, thereby minimizing the area of the inner cladding and thus minimizing the required fiber length. See, for example, H. Po et al., *Double-clad high brightness Nd fiber laser pumped by GaAlAs phased array* (cited above). Subsequent simulations showed that both a rectangular and a D-shaped cladding can provide a pump absorption in excess of 90%, or over one order of magnitude larger than a circular cladding. See, for example, V. Reichel et al., *High-power single-mode Nd-doped fiber-laser* (cited above).

Helical pump rays have also been reduced by inducing mode mixing via bending the fiber. See, for example, A. Liu et al., *The absorption characteristics of circular, offset, and rectangular double-clad fibers* (cited above); H. Zellmer et al., *Double-clad fiber laser with 30 W output power*, Proceedings of Optical Amplifiers and their Applications, OSA Trends in Optics and Photonics Series, Vol. 16, July 1997, pages 137–140; H. Zellmer et al., *High-power cw neodymium-doped fiber laser operating at 9.2 W with high beam quality*, Optics Letters, Vol. 20, No. 6, March 1995, pages 578–580; and A. Liu et al., *The absorption characteristics of rare earth doped circular double-clad fibers*, Optical Review, Vol. 3, No. 4, July–August 1996, pages 276–281. Helical pump rays have also been reduced by mode scrambling, as described, for example, in A. Tünnermann, *High-power Nd double-clad fiber lasers*, Proceedings of Conference on Lasers and Electro-Optics, CLEO'96, Paper CFJ1, 1996, page 528. A particularly effective design involves bending the fiber in a kidney-shaped geometry, as described, for example, in H. Zellmer et al., *Double-clad fiber laser with 30 W output power* (cited above). Theoretical studies of the absorption efficiency of various double-clad fiber profiles as a function of fiber length and bend radius can be found in the above-cited A. Liu et al., *The absorption characteristics of circular, offset, and rectangular double-clad fibers*, and in the above-cited H. Zellmer et al., *Double-clad fiber laser with 30 W output power*.

Alternative techniques can be used to couple pump light into a double-clad fiber. For example, side-pumping via a prism is illustrated in Th. Weber et al., *A longitudinal and side-pumped single transverse mode double-clad fiber laser with a special silicone coating*, Optics Communication, Vol. 115, No. 1–2, March 1995, pages 99–104; and in Th. Weber et al., *Side-pumped fiber laser*, Applied Physics B, Vol. 63, No. 2, August 1996, pages 131–134. If the outer cladding is made of a polymer such as silicone, it can be locally stripped. A prism of appropriate angle is clamped against the exposed inner cladding and pump light is coupled through the prism into the cladding. This method has proved to transfer the pump power to the core quite effectively, as described, for example, in Th. Weber et al., *A longitudinal and side-pumped single transverse mode double-clad fiber laser with a special silicone coating*, cited above.) This method has also been applied to launch pump light at two different locations simultaneously into the same fiber in, for example, Th. Weber et al., *Side-pumped fiber laser* (cited above).

Although such other techniques are available, experimental measurements in a Ho/Tm-doped fiber laser have shown that core pumping is still the most efficient method. See, for example, C. Ghisler et al., *Cladding-pumping of a $Tm^{3+}$:$Ho^{3+}$ silica fibre laser*, Optics Communication, Vol. 132, No. 5–6, December 1996, pages 474–478. In these experiments, cladding pumping produced a higher threshold (by a factor of approximately 2.3) and a lower slope efficiency (by approximately 43%) than core pumping. Side pumping yielded the same threshold as cladding pumping but a still lower slope efficiency (by approximately 18%).

Another method developed specifically to couple light from a high-power laser diode bar is described, for example, in L. A. Zenteno, *Design of a device for pumping a double-clad fiber laser with a laser-diode bar*, Applied Optics, Vol. 33, No. 31, November 1994, pages 7282–7287; and in H. Po et al., *High power neodymium-doped single transverse mode fibre laser*, Electronics Letters, Vol. 29, No. 17, August 1993, pages 1500–1501. This method uses a bundle comprising a large number of multimode fibers arranged at one end into an array shaped to match the laser-diode emitting area. For example, the bundle is arranged into a linear shape to match a long and thin laser diode bar. The pump light is coupled into the bundle with a cylindrical lens. At the output end of the bundle, the fibers are arranged into a two-dimensional cross-section matched to the double-clad fiber pump cladding.

Another method demonstrated with a 1.5-μm Er/Yb fiber amplifier is described, for example, in L. Goldberg et al., *V-groove side-pumped 1.5 μm fibre amplifier*, Electronics Letters, Vol. 33, No. 25, December 1997, pages 2127–2129. In accordance with this method, a V groove is polished into the side of the pump cladding. Pump light is focused through the side of the fiber onto a polished face of the groove and reflected by total internal reflection into the pump cladding. When a V-groove coupler is used, as much as 76% of the output power of a laser diode array was coupled into a pump cladding. (See, for example, L. Goldberg et al., *V-groove side-pumped 1.5 μm fibre amplifier* (cited above).

Side pumping using a multimode fiber coupler has also been reported in, for example, V. Gapontsev et al., *25 kW peak power, wide-tunable-repetition-rate and pulse duration eye safe MOPFA laser*, Proceedings of Conference on Lasers and Electro-Optics, CLEO'96, Vol. 9, Paper CTuU3, 1996, pages 209–210.

SUMMARY OF THE INVENTION

Although the foregoing techniques have provided improvements in the pump power transfer per unit length of fiber, further improvements are needed. As discussed above, when double-clad fibers (DCFs) with rare-earth doped cores are used in fiber lasers and high-power fiber amplifiers, long lengths of fiber are needed to couple cladding pump light into the fiber core.

In accordance with aspects of certain embodiments of the present invention, long-period fiber gratings are placed in a predetermined pattern along an optical fiber with a doped core (e.g., a core doped with an optically active material such as, for example, a rare earth ion or other laser ion) to couple light from the cladding into the core. The long-period fiber grating is preferably selected to optically couple an inner cladding mode to a core optical mode.

Aspects of systems in accordance with the present invention may also allow the rate at which light is coupled into the core of an optical fiber to be controlled. This approach has beneficial applications in rare-earth-doped fiber devices. In particular, in erbium-doped fiber amplifiers, for example, the grating may produce a more uniform population inversion along the fiber length, e.g., by increasing the coupling farther down the optical fiber. This exemplary approach may result in a better noise figure as substantially uniform pumping can be produced over the length of the fiber.

As a result of increased coupling into the core, in some embodiments the length of the fiber over which the pump cladding light is coupled into the core may be shortened. Also, in various embodiments, mode scrambling in the cladding (resulting from power diffusion among the pump cladding modes) is used to replenish at least one selected pump cladding mode being coupled into the core. The absorption from the rare-earth ion doping in the fiber core preferably maintains the efficiency of the grating by limiting back-coupling from at least one core mode to at least one cladding mode.

In accordance with an aspect of the present invention, a double-clad optical fiber comprises a core doped with an optically active dopant. The core has a core refractive index. An inner cladding surrounds the core. The inner cladding has an inner cladding refractive index. The core refractive index is greater than the inner cladding refractive index, and the core supports at least a first core mode. An outer cladding surrounds the inner cladding. The outer cladding has an outer cladding refractive index. The inner cladding refractive index is greater than the outer cladding refractive index, and the inner cladding supports at least a first cladding mode. At least one long-period fiber grating induced in the fiber couples light from the at least one cladding mode to the at least one core mode.

In accordance with another aspect of the present invention, a double-clad optical fiber comprises an optically active core having a core refractive index. An inner cladding surrounds the core. The inner cladding has an inner cladding refractive index. The inner cladding refractive index is less than the core refractive index, and the core supports at least a first core mode. An outer cladding surrounds the inner cladding. The outer cladding has an outer cladding refractive index. The outer cladding refractive index is less than the inner cladding refractive index, and the inner cladding supports at least a first cladding mode. A plurality of long-period optical gratings induced in the fiber couple light from the at least one cladding mode to the at least one core mode.

In accordance with another aspect of the present invention, a method couples light into a double-clad fiber. The double-clad fiber comprises an optically active core supporting at least one core mode, an inner cladding supporting at least one cladding mode, and an outer cladding. The method comprises coupling light into the inner cladding to transfer optical power into an inner cladding mode. The method further comprises propagating inner cladding mode light proximate a long-period fiber grating. The long-period fiber grating causes light to be coupled from the inner cladding mode to the core mode to transfer at least a portion of the optical power from the inner cladding to the core. The long-period fiber grating has a period selected to provide phase matching between the cladding mode and the core mode to cause the optical power to be coupled between the cladding mode and the core mode.

In accordance with another aspect of the present invention, a method couples light into a double-clad fiber. The double-clad fiber comprises an optically active core supporting at least one core mode, an inner cladding supporting at least one cladding mode, and an outer cladding. The method comprises coupling light into the inner cladding to transfer optical power into an inner cladding mode. The method further comprises propagating inner cladding mode light in the effect of a long-period fiber grating. The long-period fiber grating causes light to be coupled from the inner cladding mode to the core mode to transfer at least a portion of the optical power from the inner cladding to the core. The long-period fiber grating has a period selected to provide phase matching between the cladding mode and the core mode to cause the optical power to be coupled between the cladding mode and the core mode.

In accordance with another aspect of the present invention, a double-clad optical fiber has a longitudinal axis therethrough. The double-clad optical fiber comprises a core doped with an optically active dopant. The core has a core refractive index. The core supports at least a first core mode. An inner cladding surrounds the core. The inner cladding has an inner cladding refractive index that decreases with lateral distance away from said longitudinal axis. The inner cladding refractive index is less than the core refractive index. The inner cladding supports at least a first cladding mode. An outer cladding surrounds the inner cladding. The outer cladding has an outer cladding refractive index. The outer cladding refractive index is smaller than the inner cladding refractive index. At least one long-period fiber grating is positioned on the fiber to couple light from the at least one cladding mode to the at least one core mode.

BRIEF DESCRIPTION OF THE DRAWINGS

The foregoing and other aspects and advantages of embodiments in accordance with the present invention are described below in connection with the accompanying drawings in which:

FIG. 4A schematically illustrates a perspective view of an embodiment of a laser system in accordance with the present invention, which includes a pump source that provides pump light to an end of a double-clad fiber and which includes a plurality of long-period fiber gratings positioned on the fiber;

FIG. 4B illustrates a cross section of the double-clad fiber of FIG. 4A taken along the lines 4B—4B of FIG. 4A;

FIG. 15A illustrates plots of the effective index of the modes in the mode groups versus the mode group number m for a first double-clad fiber with a core that has a step-index profile and that has an inner cladding with a step-index profile (diamond-shaped symbols);

FIG. 15C illustrates plots of the effective index of the modes in the mode groups versus the mode group number m for a third double-clad fiber that has a core having a triangular-index profile and that has an inner cladding having a parabolic-index profile (triangle-shaped symbols);

DETAILED DESCRIPTION OF THE PREFERRED EMBODIMENTS

Figure 1A:
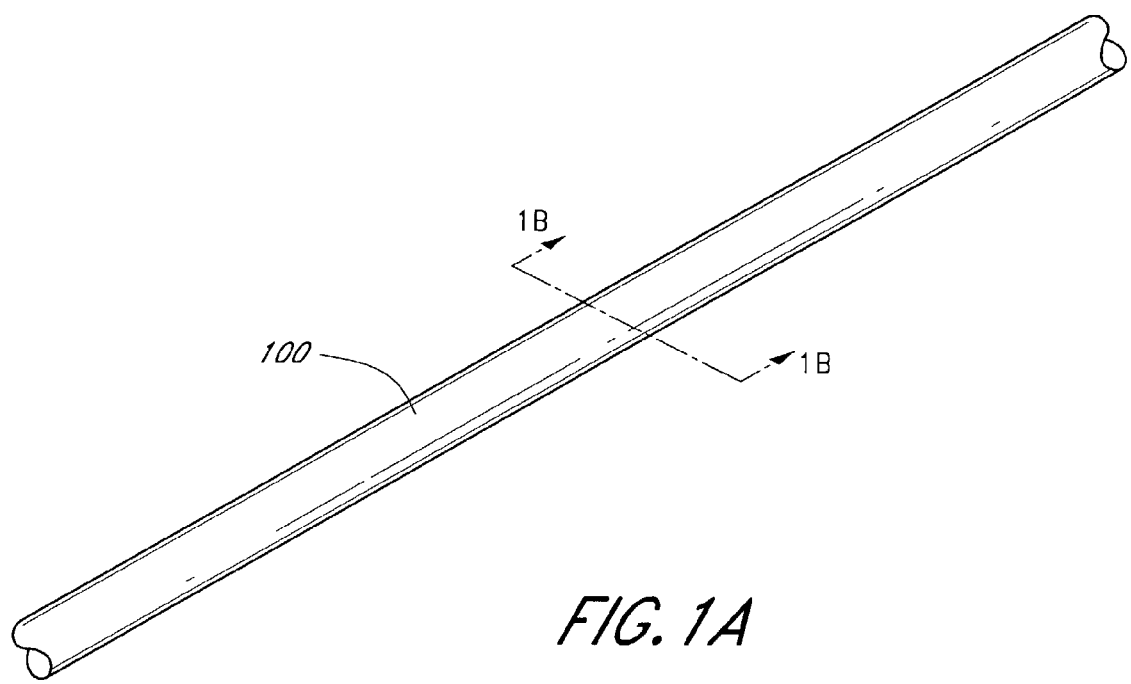
FIG. 1A illustrates a perspective view of a double-clad fiber (DCF)
Figure 1B:
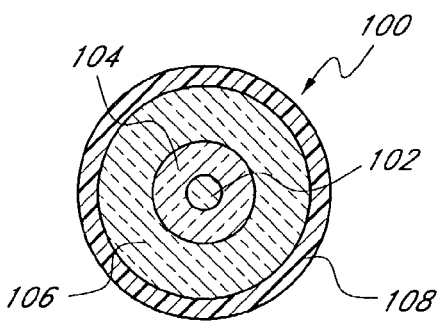
FIG. 1B illustrates a cross-sectional view of the double-clad fiber of FIG. 1A taken along the lines 1B—1B in FIG. 1A, in which the double-clad fiber has a basic configuration comprising a generally circular core surrounded by a generally circular first (inner) cladding, which is surrounded by a generally circular second (outer) cladding.

An exemplary double-clad fiber 100 is illustrated in perspective in FIG. 1A and in cross section in FIG. 1B. The double-clad fiber 100 comprises a single-mode core 102 having a generally circular cross section or other shapes, such as, for example, elliptical to produce a polarization-maintaining fiber. The core 102 is surrounded by a first (or inner) cladding 104, which also has a generally circular cross section. The core 102 is substantially centered within the inner cladding 104. The inner cladding 104 is surrounded by a second (or outer) cladding 106, which also has a generally circular cross section. The inner cladding 104 is centered within the outer cladding 106. The outer cladding 106 is surrounded by one or more protective coatings (e.g., a protective jacket) 108.

Figure 1C:
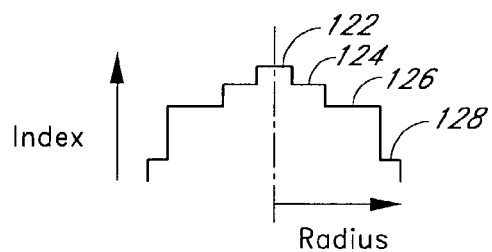
FIG. 1C illustrates the refractive index profile of the basic configuration of the double-clad fiber of FIGS. 1A and 1B.

As illustrated by an index profile in FIG. 1C, the core 102 has a first refractive index 122. The inner cladding 104 has a second refractive index 124, which is lower than the first refractive index 122. The outer cladding 106 has a third refractive index 126, which is lower than the second refractive index 124. The protective coating 108 has a fourth refractive index 128, which is lower or higher than the third refractive index 126.

By selecting the refractive indices as illustrated in FIG. 1C, the core 102 forms a first waveguide within the inner cladding 104, and the inner cladding 104 forms a second, highly multimoded waveguide within the outer cladding 106.

Preferably, only the core 102 of the fiber 100 is doped with a rare-earth ion. The composition of the core glass is preferably selected to accept a high concentration of the dopant. If the dopant concentration is too low, the fiber length required to absorb a sizable fraction of the pump power will be hundreds of meters, which means a prohibitively high scattering loss and threshold for the fiber laser or amplifier. By using a core glass composition that tolerates higher quenching-free rare-earth concentrations, and by properly designing the cladding-to-core area ratio, most of the pump power can be absorbed in a few to tens of meters of fiber. For example, a germano-alumino-silicate glass with a concentration of 0.5 wt. % $Yb_2O_3$ is advantageously used in one embodiment in accordance with the present invention. Many other combinations of glass compositions, rare-earth dopants and concentrations of dopants can also be advantageously used.

The numerical aperture (NA) of the inner cladding 104 should be as high as possible in order to capture as much of the pump power as possible. For silica-based fibers with a outer cladding 106 comprising glass, the NA is limited to approximately 0.4. Higher numerical apertures (NAs) can be achieved if the outer cladding is made of a low-refractive-index polymer, such as, for example, a Teflon-based polymer having a refractive index around 1.3. NAs as high as 0.6 have thus been achieved, as described, for example, in D. J. DiGiovanni et al., *High-power fiber lasers* (cited above).

Figure 2A:
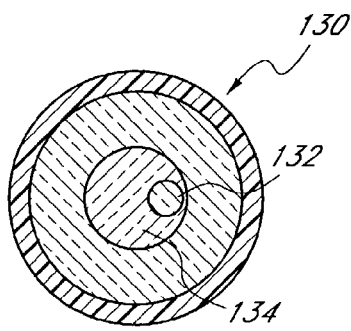
FIG. 2A illustrates an embodiment of a double-clad fiber having an offset core within the first (inner) cladding.
Figure 2B:
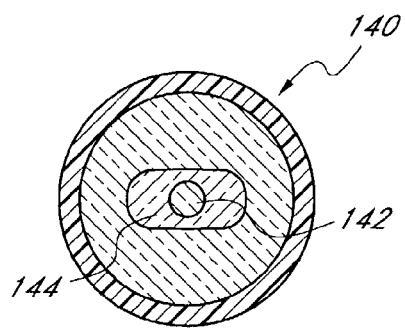
FIG. 2B illustrates an embodiment of a double-clad fiber having a core surrounded by a rectangular first (inner) cladding.
Figure 2C:
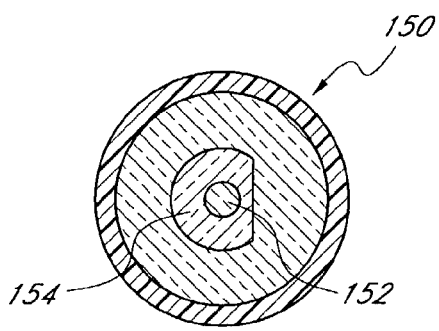
FIG. 2C illustrates an embodiment of a double-clad fiber having a core surrounded by a D-shaped first (inner) cladding.
Figure 2D:
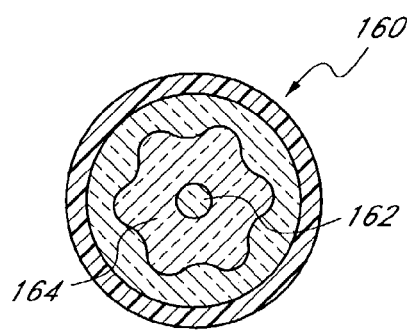
FIG. 2D illustrates an embodiment of a double-clad fiber having a core surrounded by a scalloped first (inner) cladding.

Other shapes can also be used for the double-clad fiber 100. For example, FIG. 2A illustrates a double-clad fiber 130 wherein the core 132 is offset within the inner cladding 134. FIG. 2B illustrates a double-clad fiber 140 wherein the core 142 is surrounded by an approximately rectangular inner cladding 144. FIG. 2C illustrates a double-clad fiber 150 having a core 152 surrounded by a D-shaped inner cladding 154. FIG. 2D illustrates a double-clad fiber 160 having a core 162 surrounded by a scalloped inner cladding 164. Each of the embodiments of FIGS. 2A, 2B, 2C and 2D advantageously reduce the incidence of helical rays, as discussed, for example, in A. Liu et al., *The absorption characteristics of circular, offset, and rectangular double-clad fibers* (cited above).

In the embodiments of FIGS. 1A and 1B, 2A, 2B, 2C and 2D, pump light is preferably not coupled into the fiber by coupling the light into the core. Rather, the pump light is coupled into the inner cladding (e.g., the inner cladding 104 of the double-clad fiber 100 of FIGS. 1A and 1B) by end coupling so that the pump light is distributed over a large number of modes within the inner cladding 104. Some of these modes have spatial distributions that extend into the core. Accordingly, as these modes travel down the inner cladding 104, the pump light they carry overlaps spatially with the doped core 102 and is absorbed by the dopant.

Figure 3A:
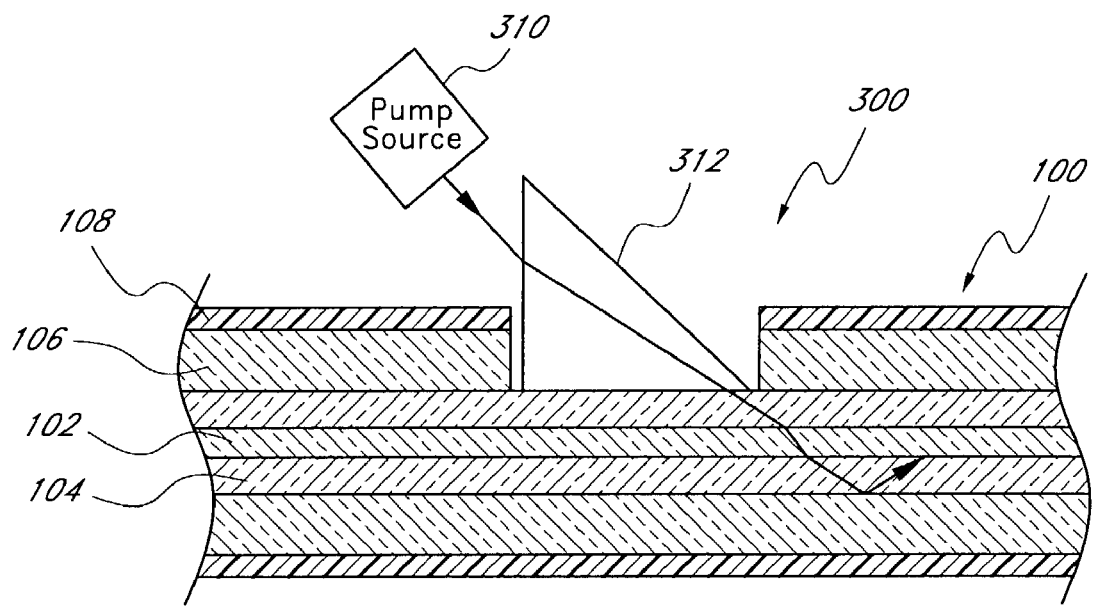
FIG. 3A illustrates a side-coupling method that uses a prism to inject pump light into the first (inner) cladding of a double-clad fiber.
Figure 3B:
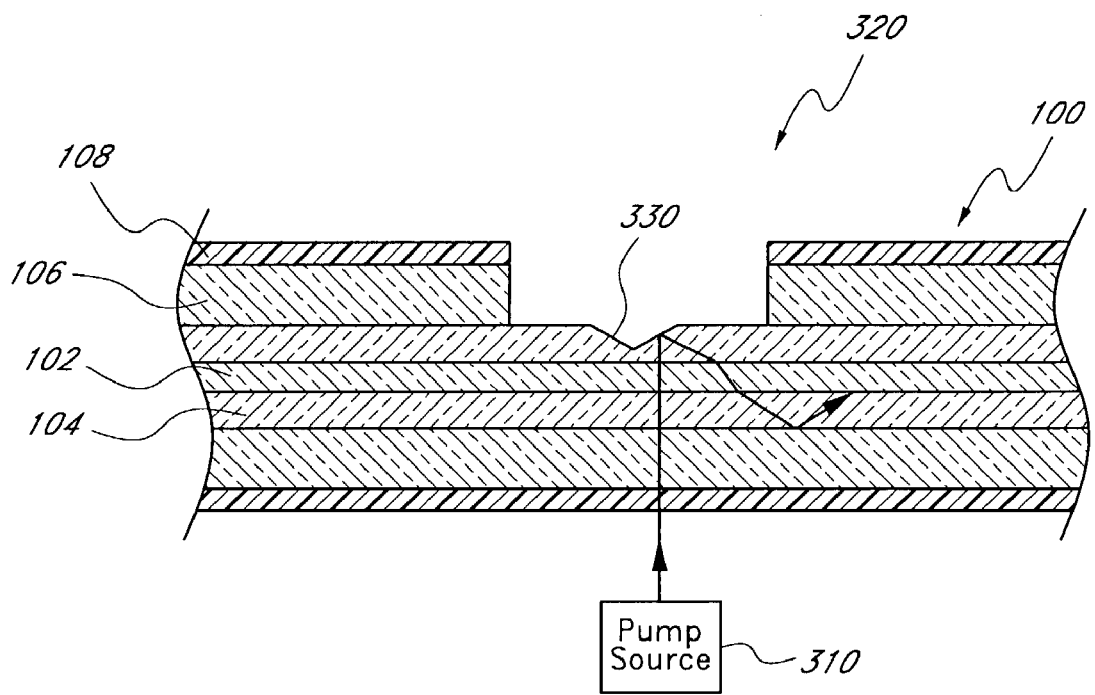
FIG. 3B illustrates an alternative side-coupling method that uses a V groove to inject pump light into the first (inner) cladding of a double-clad fiber.

The pump light is advantageously coupled into the inner cladding 104 of the fiber 100 by one of the methods illustrated in FIGS. 3A and 3B. For example, in a first laser system 300 illustrated in FIG. 3A, pump light from a large-area laser diode 310 is injected into the inner cladding 104 of the fiber 100 via a prism 312 placed on the inner cladding 104 of the fiber 100 in a location where the protective jacket 108 and the outer cladding 106 are removed. The prism 312 can be advantageously placed on the inner cladding 104 in accordance with a technique described, for example, in Th. Weber et al., *A longitudinal and side-pumped single transverse mode double-clad fiber laser with a special silicone coating* (cited above) and in Th. Weber et al., *Side-pumped fiber laser* (cited above).

In a second laser system 320 illustrated in FIG. 3B, pump light from the large-area laser diode 310 is injected into the inner cladding 104 of the fiber 100 by using a V groove coupler 330 formed on the inner cladding 104 of fiber 100 in a location where the protective jacket 108 and the outer cladding 106 are removed. The V groove coupler 330 can advantageously be formed on the inner cladding 104 of the fiber 100 in accordance with a technique described, for example, in L. Goldberg et al., *V-groove side-pumped 1.5 μm fibre amplifier* (cited above). Pump light is focused onto a polished face of the V groove coupler 330 and is reflected by total internal reflection into the inner cladding 104. Like prism coupling, V-groove coupling leaves the fiber ends free and available, for example, for splicing. V-groove coupling and prism coupling also enable pump injection at multiple points along the fiber 100. These methods may produce highly efficient coupling of pump light into the inner cladding 104. When the V-groove coupler 330 is used, for example, as much as 76% of the output power of the laser diode 310 can be coupled into a pump cladding. See, for example, L. Goldberg et al., *V-groove side-pumped 1.5 μm fibre amplifier*, cited above.

Other techniques for injecting pump light into the inner cladding of a double-clad fiber can also be used in combination with the system described below.

The coupling efficiency between the light source and the optical fiber depends in part on the characteristics of the light source and those of the fiber. The area of the inner cladding 104 is typically tens to hundreds times larger than the area of the core 102. In addition, since the numerical aperture (NA) of the inner cladding 104 is large, a substantial fraction of the output power of the large-area laser diode 310 can be injected into the inner cladding 104. For example, the large-area laser diode 310 may be implemented as a laser diode array. Unlike a single-mode laser diode, the large-area laser diode 310 is able to emit a very high output power (e.g., in excess of 100 watts). On the other hand, the large-area laser diode 310 exhibits a low brightness and cannot be coupled efficiently directly into the single-mode core 102. As shown in more detail below, with an efficient laser transition, such as the $^4F_{3/2} \rightarrow {}^4I_{11/2}$ transition of $Nd^{3+}$, a double-clad laser system in accordance with a configuration described herein transforms a substantial fraction of the pump power launched into the inner cladding 104 into a highly spatially coherent output, with a brightness that can be thousands of times higher than that of the pump source. The double-clad fiber laser therefore acts as a brightness converter because it efficiently converts the low-brightness, multimode light of a high-power laser diode into high-brightness, single-mode laser radiation.

One aspect of embodiments in accordance with the invention described herein is a method of using long-period fiber gratings placed along a double-clad fiber with a core doped with a laser ion (such as $Er^{3+}$, $Nd^{3+}$, $Tm^{3+}$, or $Yb^{3+}$ for instance) to couple one or more pump cladding modes to a pump core mode. Pump radiation can be coupled into the cladding to excite cladding modes in the double-clad fiber. The long-period fiber grating causes optical power in the cladding modes to be transferred into one or more of the modes supported by the core. In this manner, light can be more efficiently introduced into the core.

FIGS. 4A and 4B illustrate a laser system 400 in accordance with a first embodiment. A double-clad fiber (DCF) 410 has a core 412, an inner cladding 414, an outer cladding 416 and a protective coating or jacket 418, as discussed above. Pump light from a pump source (e.g., a large-area laser diode) 420 is coupled into the inner cladding 414 of the DCF 410 using, for example, end coupling. A lens 422 between the pump source 420 and the DCF 410 assists in coupling.

After propagating for a distance along the DCF 410, the pump power is distributed in some fashion among the groups of linearly polarized (LP) modes supported by the inner cladding 414. For example, after a sufficiently long distance of propagation, the pump power may be distributed approximately evenly between the groups of modes, as described, for example, in D. Gloge, *Optical power flow in multimode fibers, Bell System Technical Journal*, Vol. 51, No. 8, October 1972, pages 1767–1783. The pump power distribution, however, does not need to be even for the embodiments the present invention and may preferentially fill one or more core modes. For purposes of the following description, the groups of modes are numbered with an index m, where m varies between a minimum value of 2 and some maximum value M. The maximum value depends on the dimension and numerical aperture of the inner cladding 414. As an approximation, all of the modes in one group of modes have substantially the same propagation constant for certain geometries. A group of modes having index m contains all the linear polarization modes $LP_{lq}$ satisfying m=l+2q, where l is the azimuthal mode number which characterizes the azimuthal symmetry of the mode and q is the radial mode number. The group m=2 (i.e., the group with index m=2) represents the lowest order group of modes and includes only the fundamental mode $LP_{01}$. The next group m=3 also includes only one mode, namely $LP_{11}$. The group m=4 includes two modes, $LP_{02}$ and $LP_{21}$. As an approximation, the $LP_{02}$ and $LP_{21}$ modes have approximately the same propagation constant, but different azimuthal symmetries.

All of the pump power is initially coupled into the inner cladding 414 and core and is distributed in some fashion among the M−2 groups of modes. Due to small random variations in the size, shape, and in general the index profile of the inner cladding 414, both along the length of the fiber 410 and along the perimeter of the inner cladding 414, these groups of modes are coupled to each other in such a way that after propagating a sufficient distance in the fiber, the optical power is distributed throughout the different mode groups. In some embodiments in accordance with the present invention, all groups of modes carry substantially the same power after propagation through a first unaltered portion 430 of the DCF 410 having a length L. (Substantially even distribution of the power among the modes is not required, and such distribution is only assumed for the purpose of the following description. In various preferred embodiments, for example, a more power is preferably launched into the core mode. Nevertheless, the case where power is substantially evenly distributed among the modes is considered for explanatory purposes.) The selected distance (or length) L depends on the magnitude and frequency spectrum of the spatial perturbations. For fibers fabricated by standard methods, it is possible to have a distance L in a range of 4–5 centimeters.

After the first unaltered portion 430 of length L, a first long-period fiber grating (LPFG) 432 is placed on a portion 434 of the DCF 410. As discussed above, all the groups of modes carry substantially the same power after propagating the distance L through the first portion 430 of the DCF 410. The first LPFG 432 can be written in the portion 434 by standard ultraviolet (UV) methods by using a photosensitive fiber for the DCF 410. Alternatively, as illustrated in FIGS. 4A and 4B, the first LPFG 432 can be formed by clamping a mechanically ruled or chemically etched grating onto the portion 434 of the DCF 410, as described, for example, in U.S. Pat. No. 6,282,341 for Tunable, Mechanically Induced Long-Period Fiber Grating with Enhanced Polarizing Techniques. Other techniques for placing the first LPFG 432 on the DCF 410 can also be used.

For most applications, the DCF 410 is selected such that its core 412 supports only a single mode (e.g., the $LP_{01}$ core mode). All modes other than the $LP_{01}$ core mode have most of their respective optical energies in the cladding and are referred to as cladding modes. In one preferred embodiment, the first LPFG 432 is designed to couple the $LP_{02}$ cladding mode (group m=4) to the $LP_{01}$ core mode of the DCF 410 within the portion 434. The LPFG 432 is employed to couple light in the $LP_{02}$ cladding mode into the $LP_{01}$ core mode. The grating 432 provides phase matching to accommodate the different propagation constants of the $LP_{02}$ cladding mode and the $LP_{01}$ core mode. As optical power is transferred into the $LP_{01}$ modes from the $LP_{02}$ mode, optical power within other modes in the set, i.e., the $LP_{21}$ mode, may flow into the $LP_{02}$ mode. The LPFG preferably couples this energy as well into the $LP_{01}$ core mode. Preferably, the coupling length and the overall length of the first LPFG 432 in various embodiments are designed in accordance with well-known principles such that substantially all of the power in the $LP_{02}$ mode and any power in the $LP_{21}$ transferred to the $LP_{02}$ mode is coupled to the $LP_{01}$ core mode of the DCF 410, as discussed more fully below.

After the power has propagated in the portion 434 of the DCF 410 subject to the effects of the first LPFG 432, a fraction of the power traveling in the inner cladding 414 has been coupled into the core 412. This fraction corresponds to the portion of the light in the m=4 mode group, i.e., the $LP_{02}$ and $LP_{21}$ cladding modes. In an embodiment in which the power is approximately evenly distributed among the M−2 cladding mode groups (e.g., among the m=3 cladding mode group and the m=4 cladding mode group when M=4), this fraction corresponds to 1/(M−2) of the pump power in the cladding. The power then propagates the distance L through a second unaltered portion 440 of the DCF 410 (e.g., a portion of the DCF 410 where no LPFG is formed). Within the second unaltered portion 440, the power present in the core 412 is partially or fully absorbed by the dopant present in the core 412, thus creating a population inversion in the laser ion. Because of the diameter perturbations or other index profile perturbations in the DCF 410 discussed above, power is also coupled among cladding modes and redistributed among the mode groups. After propagating the distance L through the second unaltered length 440 of the DCF 410, if L is long enough, all the groups of modes again carry substantially the same power. Thus, there is again power in the m=2 group of modes.

A second LPFG 442 is placed on a portion 444 of the DCF 410 following the second unaltered portion 440. The second LPFG 442 couples substantially all of the power in the m=2 group of modes into the $LP_{01}$ core mode. This incremental coupled power is equal to:

$$1 - \frac{1}{\frac{M-2}{M-2}} \quad (1)$$

The second LPFG 442 is followed by a third unaltered portion 450 of the DCF 410 on which no LPFG is formed. The power propagates the distance L through the third unaltered portion 450 and then enters a portion 454 onto which a third LPFG 452 is formed. The structure of an unaltered portion of the DCF 410 followed by a portion having an LPFG formed thereon is iterated such that a chain of LPFGs is placed along the DCF 410 at regular intervals for the desired total length of DCF 410 to be excited. The total length can be determined by the particular device being considered. The total length can also be determined by a different criterion. For example, no further LPFGs are useful when, at a point on the DCF 410, the power remaining in the inner cladding 414 is insufficient to create a useful inversion.

Figure 5:
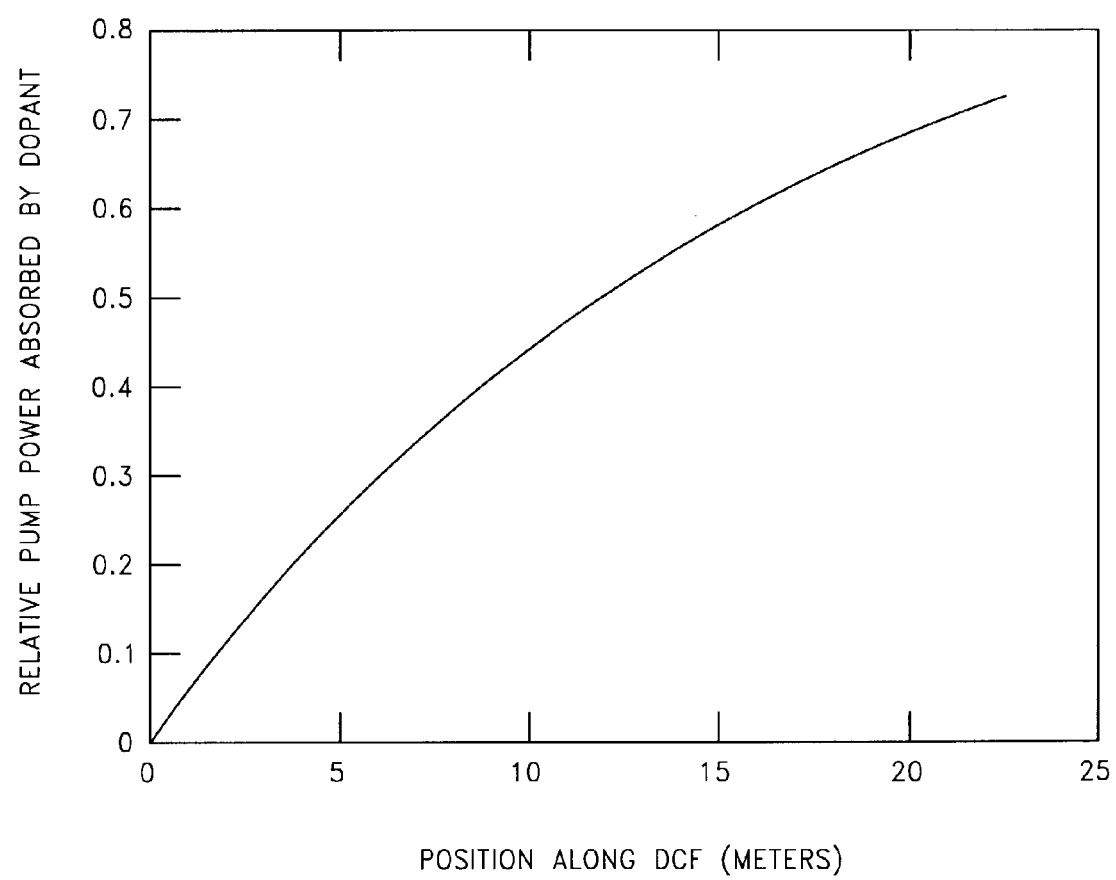
FIG. 5 illustrates results from a simulation of the amount of pump power absorbed by the fiber core along the length of a double-clad fiber with a doped core and with LPFGs equally spaced along the length of the double-clad fiber.

FIG. 5 illustrates the results of a computer simulation of the foregoing structure and process. The horizontal axis represents the position along the DCF 410 in meters, and the vertical axis represents the relative pump power absorbed by the dopant at each position. The simulation is based on a mathematical description of the coupling process. For the simulation, the fiber core 412 is assumed to be doped with a dopant that exhibits an absorption length of 10 centimeters at the pump wavelength. Each LPFG is selected to be 2.5 centimeters long. The distance L between each LPFG is substantially constant and is selected to be 10 centimeters. The DCF 410 has a core diameter of 5 microns, has a core numerical aperture (NA) of 0.17, has an inner cladding diameter of 100 microns, and has an inner cladding NA of 0.24.

For simplicity in implementing the simulation, pump absorption and coupling among groups of cladding modes is neglected along the length of each LPFG. Each one of these two processes would contribute to increasing the rate at which pump power is coupled from the cladding to the core. Thus, introducing these processes into the mathematical model would improve the results shown in FIG. 5.

As illustrated by the results shown in FIG. 5, the pump power is gradually coupled into the core. After a length of 10 meters, more than 40% of the pump power has been coupled from the cladding into the core and absorbed by the core dopant. After a length of about 23 meters, about 75% of the pump power has been absorbed by the dopant. In comparison to the results in FIG. 5, if the same pump power was applied to a DCF without LPFGs, the length of the DCF required to absorb the same percentage (i.e., 75%) of the pump power launched into the cladding would be approximately 55 meters. Thus, in the illustrated example, the reduction in length provided by the LPFGs in accordance with this aspect of the invention is a factor of about 2.4.

Further fiber length reduction can be accomplished with other embodiments. For example, for a DCF with an inner cladding diameter of 400 microns and having other parameters similar to the previously described fibers, applying a sequence of LPFGs to the fiber causes more than 95% of the pump power to be absorbed in about 19 meters. The same fiber without the LPFGs would require a length of 640 meters to absorb the same percentage of pump power. Thus, the reduction in fiber length is a factor of over 33.

The present invention can be incorporated into alternative embodiments. For example, a single LPFG can be fabricated along the entire length of the DCF. As a further example, LPFGs of various lengths can be positioned at various places along the DCF. Fiber gratings many meters long can now readily be fabricated in the fiber manufacturing industry, making such alternative embodiments practical to implement.

In certain embodiments, an LPFG can have a constant coupling strength along the entire grating length. Alternatively, an LPFG can have a coupling strength that varies along the length of the DCF in a predetermined fashion to accomplish a desired distribution of population inversion along the DCF. This strength distribution may take advantage of the fact, for example, that the pump power is necessarily depleted from the pump input end ($z=0$) to the pump output end ($z=L_t$) of the DCF. For example, if a substantially constant inversion along the DCF is required, the strength of the LPFG preferably increases from $z=0$ to $z=L_t$. The same phenomenon also affects the first embodiment having a discrete distribution of LPFGs. Thus, the LPFGs closer to the pump source may be configured to have a lower coupling strength to compensate for the higher pump power.

In an LPFG having an overall length greater than one coupling length, pump power is coupled back and forth between the core and the cladding. That is, the pump power is transferred into and out of the core, but each time the pump power travels through the core some of the pump field is absorbed by the core dopant. Although increasing the length of each section of the LPFG does not optimally reduce the overall DCF length, increasing the length of each section can have other benefits. For example, fewer LPFGs may be easier to manufacture, may be simpler, may be less expensive and may provide other improvements in technical performance.

Figure 6:
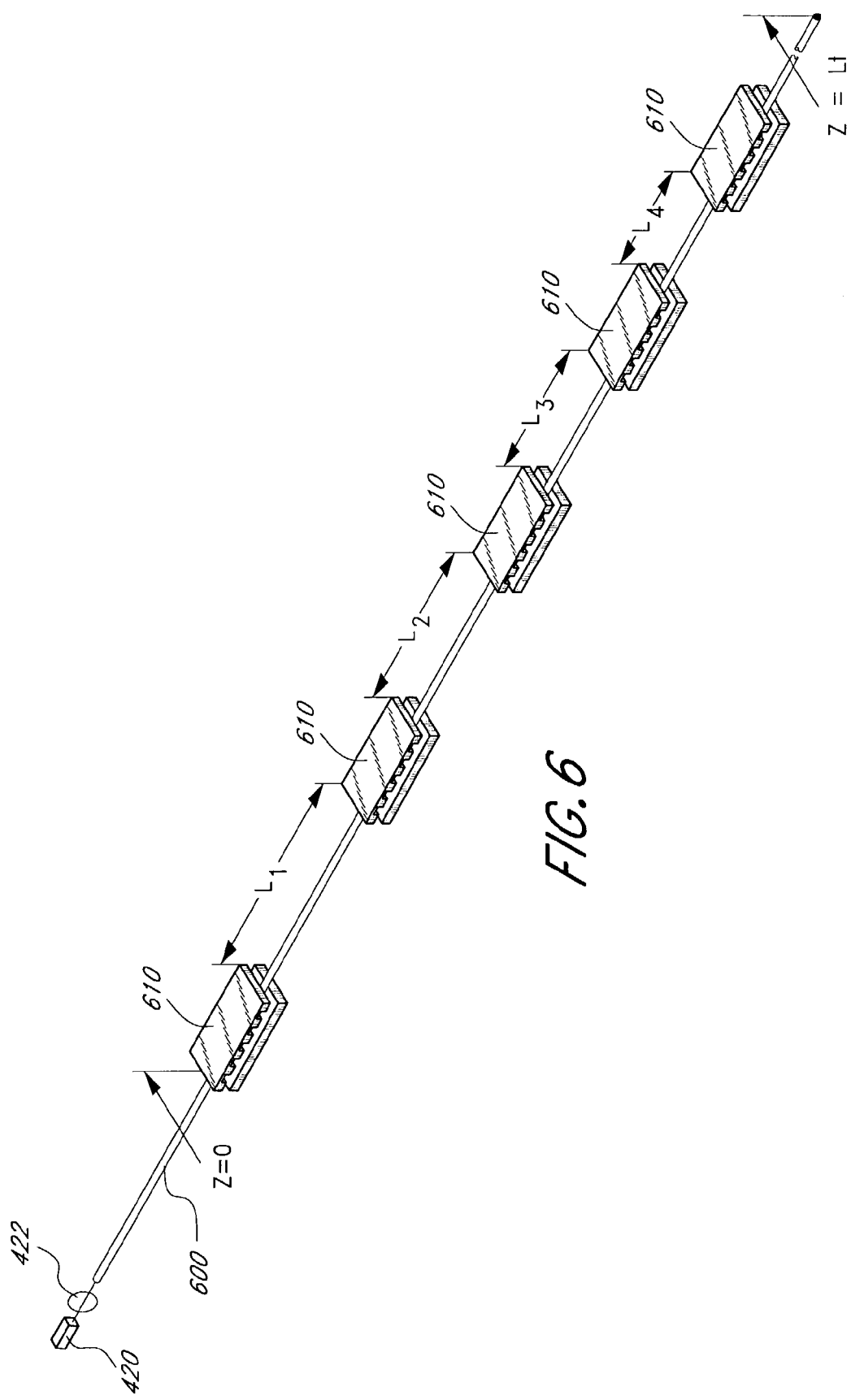
FIG. 6 illustrates a schematic of an alternative embodiment of a double-clad fiber for use in a laser system in which the long-period fiber gratings are unevenly spaced along the length of the fiber.

FIG. 6 illustrates a further alternative embodiment of a DCF 600 for use in a laser or amplifier system. A plurality of LPFGs 610 are formed on the DCF 600. The LPFGs 610 are discrete as discussed above; however, the LPFGs 610 are not equally spaced along the DCF 600. Rather, the spacings between the LPFGs 610 are varied to form a pattern to create a desired distribution of population inversion along the fiber or to produce any other effect that affects the performance of the fiber device, laser, amplifier, broadband source, or other optical device into which the DCF 600 is incorporated. For example, as illustrated in FIG. 6, the distances between successive LPFGs 610 are advantageously reduced as the LPFGs 610 are positioned on the DCF 600 from $z=0$ to $z=L_t$ in order to offset the decrease in pump power along the length of the DCF. The distances can advantageously be selected to create a constant or a nearly constant population inversion along the DCF.

Figure 7:
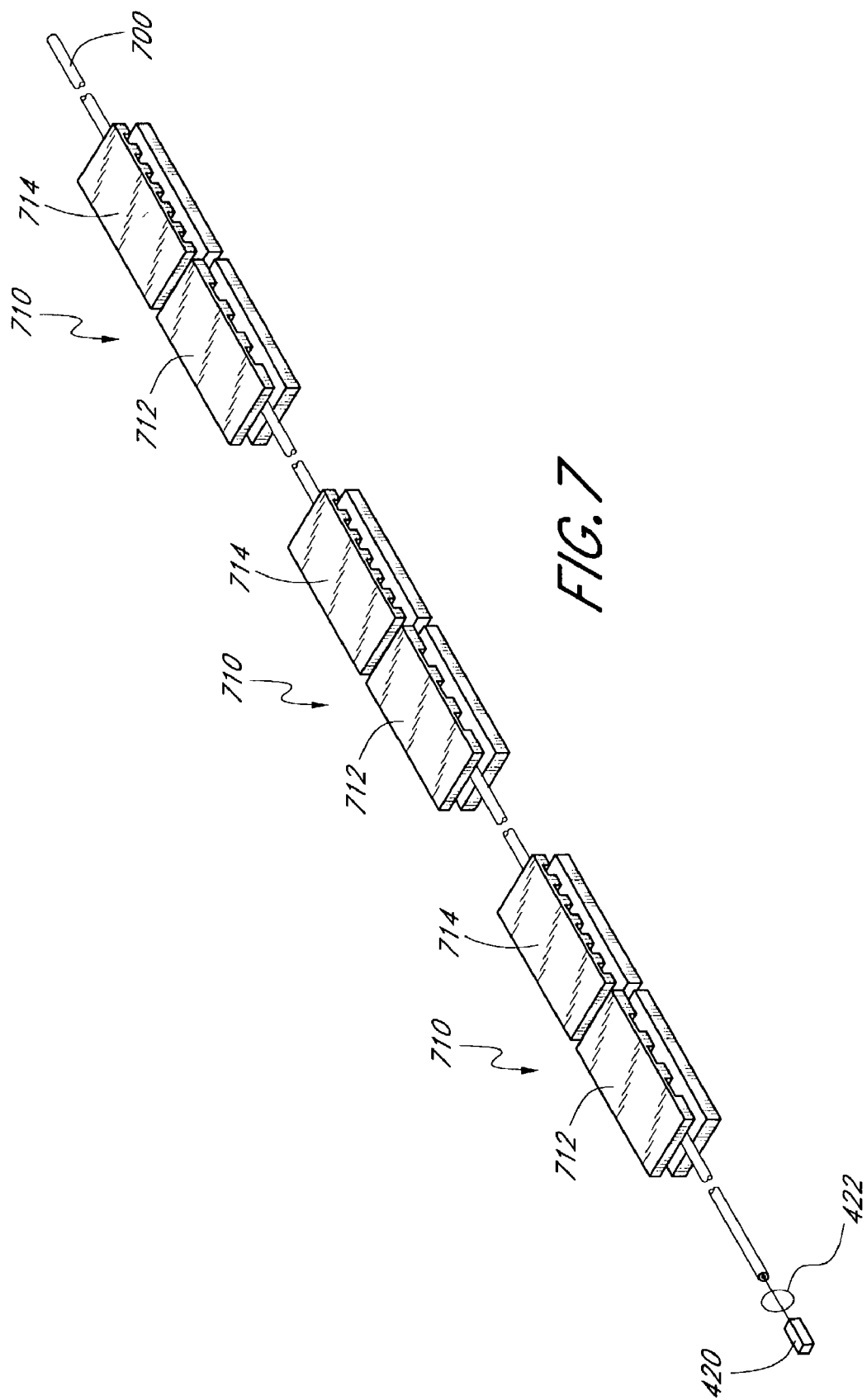
FIG. 7 illustrates a schematic of an alternative embodiment of a double-clad fiber for use in a laser system in which at least two long-period fiber gratings are included at each grating node of the fiber.

FIG. 7 illustrates another alternative embodiment of a DCF 700 in which a plurality of LPFG nodes 710 are located along the DCF 700 at discrete locations. In FIG. 7, each LPFG node 710 comprises at least a first LPFG 712 and a second LPFG 714. For example, the first and second LPFGs 712, 714 can be placed next to each other along the fiber 700, as illustrated in FIG. 7. Alternatively, in an embodiment not shown, the first and second LPFGs can be side-by-side or combined in a single grating. The first and second LPFGs may be superimposed over the same length of fiber using, for example, UV techniques for writing gratings in the core. Each LPFG 712, 714 is designed to couple one specific group of modes m to the $LP_{01}$ core mode at the respective LPFG node 710. This approach advantageously results in coupling more power from the cladding to the $LP_{01}$ core mode at each LPFG node 710 so that the required overall length of the DCF 700 is shortened.

In another alternative embodiment, the core of the DCF carries several modes instead of carrying a single mode. As is well known in the art, this type of fiber is advantageous in fiber lasers that deliver either a large peak power or a large continuous-wave power. The intensity of the power circulating in the fiber core is approximately the power in the core divided by the core area. When the intensity is too high, the power generates undesirable optical nonlinear effects that are detrimental to the operation of the laser, such as stimulated Brillouin scattering, which limits the maximum output power that can be generated. The high circulating intensity can also induce undesirable thermal effects in the core region. The high circulating intensity can also cause catastrophic breakdown of the fiber end faces. The thermal effects can also limit the maximum achievable output power. One way to reduce these intensity-dependent effects is to increase the size of the core, which reduces the intensity. A larger core supports multiple modes, which is the reason for considering this case here. This type of fiber (e.g., a fiber having a multimode core) can be pumped with multiple LPFGs (or a single LPFG covering most or all of the fiber length) in the same way as described in earlier embodiments. In addition, this type of fiber can be pumped with a different arrangement, in which each LPFG is designed to couple a particular cladding mode to one of the core modes.

Figure 8:
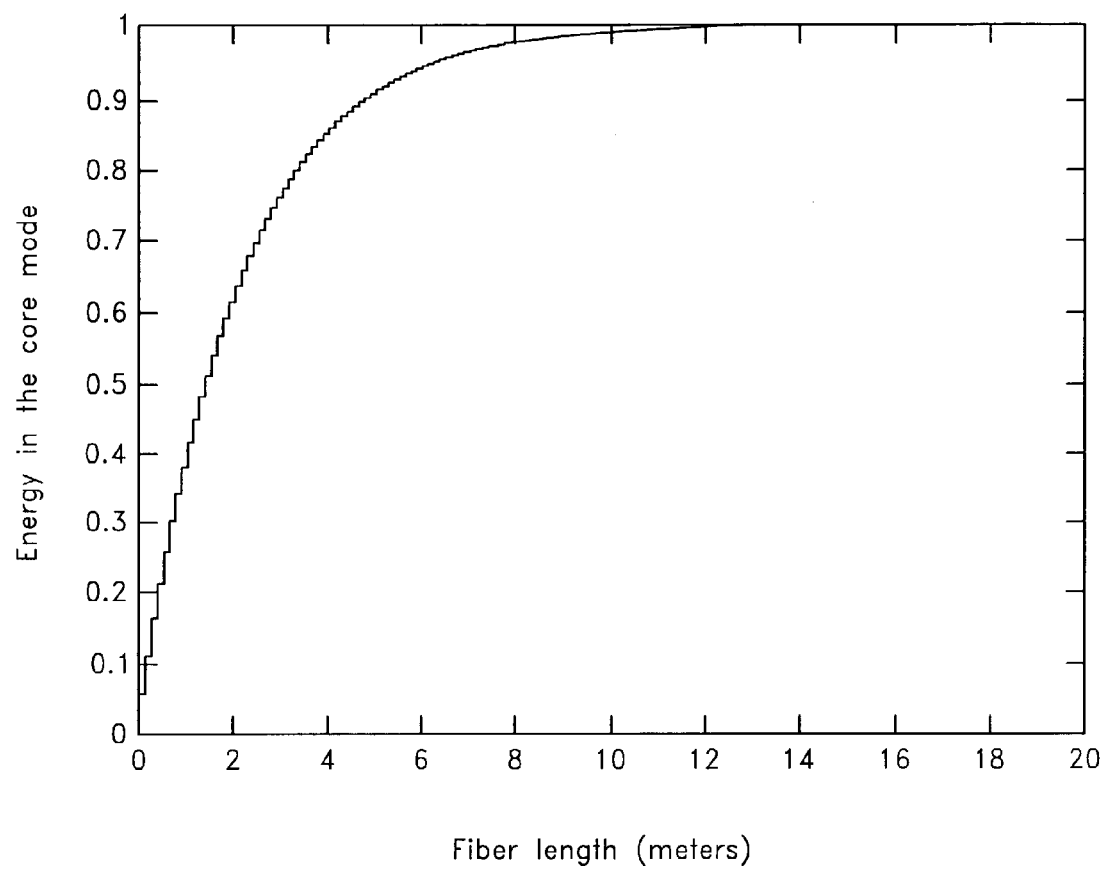
FIG. 8 illustrates results from a simulation of the amount of pump power absorbed by the fiber core along the length of a double-clad fiber with a doped core and with LPFGs equally spaced along the length of the double-clad fiber, wherein the core is a multimode core, and wherein the LPFGs couple each of 7 different cladding modes to each of 7 core modes.

The results of a simulation of an embodiment in accordance with this aspect of the invention are illustrated in FIG. 8 for a DCF with a core diameter of 20 microns and an inner cladding diameter of 40 microns. The core of the simulated DCF carries 17 modes. Each LPFG in the chain is configured to couple 7 cladding modes to 7 of the core modes. These LPFG's, for example, may comprise grating of different period superimposed (e.g., by UV fabrication techniques) or arranged sequentially along the DCF. These different gratings couple individual cladding modes into separate core modes. In particular, the $LP_{05}$ cladding mode couples to the $LP_{01}$ core mode; the $LP_{14}$ cladding mode couples to the $LP_{11}$ core mode; the $LP_{24}$ cladding mode couples to the $LP_{21}$ core mode; the $LP_{33}$ cladding mode couples to the $LP_{31}$, core mode; the $LP_{43}$ cladding mode couples to the $LP_{41}$ core mode; the $LP_{52}$ cladding mode couples to the $LP_{51}$ core mode; and the $LP_{62}$ cladding mode couples to the $LP_{61}$ core mode. The set of cladding modes (and thus the set of core modes) was selected because the modes in the sets belong to different groups of modes. In the exemplary simulation, no attempt is made to couple to the remaining 10 core modes; however, simulated embodiments in accordance with this aspect of the invention would also work if the number of core modes to which the LPFGs couple is greater or less than in number, and may include all of the core modes.

In the simulation illustrated in FIG. 8, all the couplings are performed every 10 centimeters by a respective 2.5-centimeter long LFPG (e.g., the LPFGs are spaced every 10 centimeters). As illustrated in FIG. 8, substantially all of the pump power initially in the cladding has been absorbed by the core dopant after a DCF length of about 14 meters. The curve in FIG. 8 is not optimized for length reduction (compared to the same DCF without LPFGs) and is only meant to illustrate the process.

In accordance with an aspect of the present invention, mode scrambling (e.g., power diffusion among the cladding modes) is used to replenish the one or more groups of pump cladding modes coupled by the LPFGs. Mode scrambling may be implemented as described, for example, in D. Gloge, *Optical power flow in multimode fibers* (cited above). The mode scrambling effect requires a fiber having the right level and spectrum of core diameter or other spatial perturbations. Such fibers are readily available, as described, for example, in M. E. Fermann, *Single-mode excitation of multimode fibers with ultrashort pulses, Optics Letters*, Vol. 23, No. 1, January 1998, pages 52–54.

Although the foregoing embodiments in accordance with the present invention are illustrated with a core doped with rare earth ions, the core can also be advantageously doped with other laser ions. Furthermore, the embodiments in accordance with the present invention can be implemented with types of optical waveguides other than fibers.

Embodiments in accordance with aspects of the present invention have many benefits. For example, the length of DCF needed to inject and absorb the pump cladding power into the core of the fiber can be reduced, which reduces the length of the whole fiber laser. Reducing the length of the fiber reduces the cost of the device and also makes it easier to produce stable single-longitudinal fiber lasers.

Another important reason for wanting to reduce the length of DCFs relates to applications involving high-power single-frequency fiber lasers and high-power amplifiers. In a high-power single-frequency fiber laser, the output power is scaled up to hundreds of watts by increasing the pump power to the kilowatt range (using, e.g., laser diode pumps, such as laser diode bars). The maximum output power of the fiber laser, however, is ultimately limited by the onset of stimulated Brillouin scattering (SBS). This nonlinear effect efficiently converts the narrow-linewidth laser signal circulating in the fiber laser cavity into a backward-traveling, frequency-shifted signal, which prevents any further growth of the laser output power. This deleterious effect is generally combated by increasing the threshold power of SBS, by increasing the fiber core size, by increasing the rare-earth concentration in the core, and/or by pumping at wavelengths that absorb more strongly. Increasing the rare-earth concentration in the core and pumping at wavelengths that absorb more strongly enable the DCF length to be reduced, and thus the SBS threshold power to be increased. However, the effectiveness of these methods is limited. The core size cannot be made indefinitely large, and in many application causing the laser to oscillate on the fundamental mode becomes increasingly difficult. Similarly, the rare-earth concentration in a glass core can be increased only so high before the onset of other deleterious effects, such as ion quenching, which destroys the efficacy of the ions as a laser material. Instead, by employing LPFG as discussed herein, the DCF length can be further reduced without increasing the rare-earth concentration, thus producing fiber lasers with a higher output power. For example, a twofold length reduction will enable increasing the output power of the laser by a factor of two before the onset of stimulated Brillouin scattering (SBS). The same general benefits also apply to high-power fiber amplifiers. One limiting factor is the absorption length of the dopant, which depends on the dopant.

Another benefit of embodiments in accordance with the present invention is that the proper placement of the long-period fiber gratings at specific locations along the fiber couples power from the one or more pump cladding modes into a doped core according to a predetermined pattern to cause the distribution of the dopant population inversion along the core to take a desired form. For example, the noise figure in an amplifier can be reduced by making the inversion profile more uniform, since areas of the core that see a low inversion (as may occur at the far end of a doped fiber pumped unidirectionally) suffer more strongly from the noise, and worsen the noise figure of the amplifier. Accordingly, the LPFGs may be positioned closer farther from the input end of the fiber.

Figure 9:
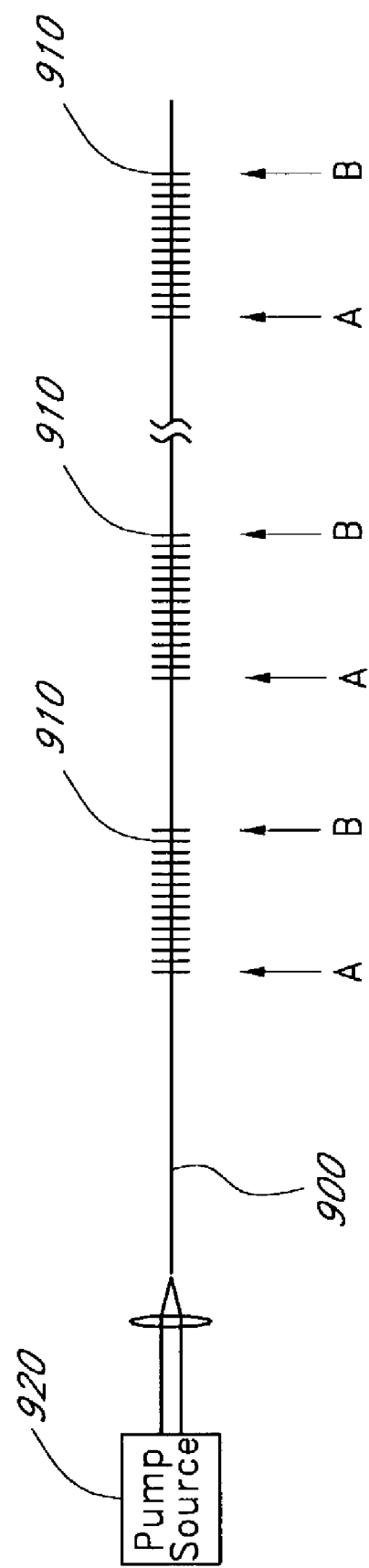
FIG. 9 schematically illustrates a further embodiment of a double-clad fiber with a plurality of long-period fiber gratings mounted thereon.

FIG. 9 illustrates a further embodiment of a DCF 900 with a plurality of LPFGs 910 mounted thereon in accordance with aspects of the present invention. The DCF 900 may be incorporated into a laser or an amplifier. The DCF 900 has a core, an inner cladding, an outer cladding and a protective coating as described above.

In FIG. 9, the DCF 900 receives pump light from a pump source 920. The pump light is preferably launched into the inner cladding, as described above. The pump light from pump source 920 can be end-coupled to the DCF 900, as shown in FIG. 9, or the pump light can be coupled to the DCF 900 by other techniques, such as, for example, by using the prism illustrated in FIG. 3A or by using the V groove illustrated in FIG. 3B.

In FIG. 9, the input of each LPFG 910 is designated as a point A, and the output of each LPFG is designated as a point B. In the embodiment of FIG. 9, pump light is launched unidirectionally at a point to the left of point A (e.g., by end-coupling, prism coupling, V-groove coupling, or the like), and the pump light travels in the forward direction (left to right in FIG. 9) such that the pump light travels in the direction from point A to point B with respect to each LPFG 910. The opposite direction is referred to herein as the backward direction.

When referred to herein in connection with the use of the DCF 900 in an amplifier, "signal" refers to an optical signal launched into the core of the DCF (either forward or backward) and amplified by the pumped DCF 900. When referred to herein in connection with the use of the DCF 900 in a laser, "signal" refers to the laser signal circulating in the DCF laser resonator.

Figure 10:
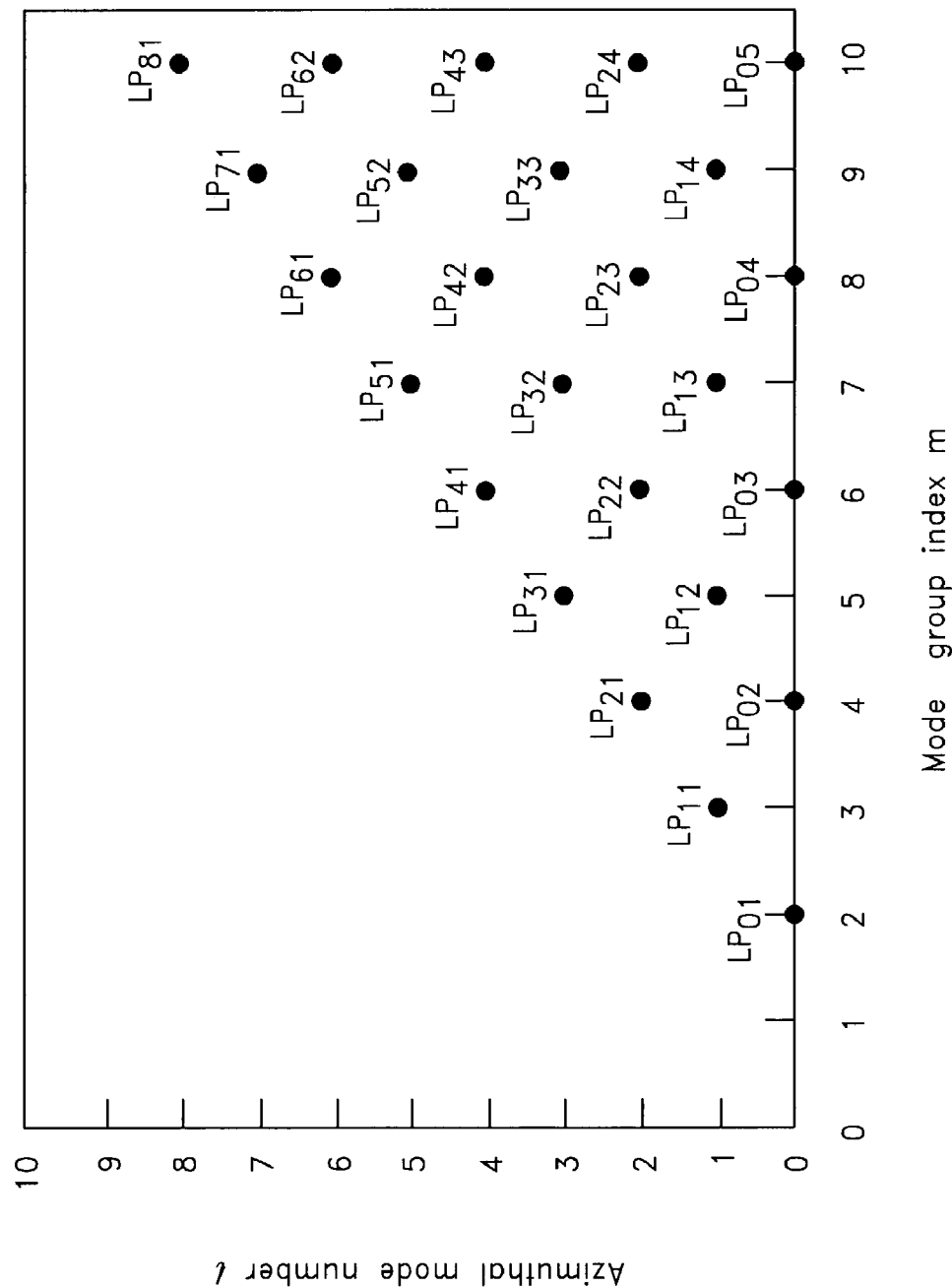
FIG. 10 graphically illustrates the individual modes $LP_{lq}$ that satisfy m=l+2q for each group index m (horizontal axis) and each azimuthal mode number l (vertical axis)

When the DCF core and inner cladding have a small numerical aperture (NA), the modes supported by the core and inner cladding are nearly linearly polarized $LP_{lq}$ modes. As discussed above, the mode numbers satisfy the relationships $l \geq 0$ and $q \geq 1$, and an index m is defined for each mode such that $m=l+2q$. Any modes that have the same index m have, as an approximation, substantially the same propagation constant $\beta_m^{cl}$. See, for example, D. Gloge, *Optical power flow in multimode fibers* (cited above). The modes are therefore conveniently lumped in groups of index m, such that all modes within a group have substantially the same propagation constant. The group index m varies between 2 and a maximum value M that depends on the cladding dimensions and the NA. FIG. 10 illustrates the individual modes $LP_{lq}$ that satisfy $m=l+2q$ for each group index m (horizontal axis) and each azimuthal mode number l (vertical axis). FIG. 10 only shows the individual modes for values of m from 2 to 10 and values of l from 0 to 10.

As discussed above, the lowest value of m is 2. In particular, the group $m=2$ (i.e., the group with index $m=2$) represents the lowest possible values of l (i.e., $l=0$) and q (i.e., $q=1$). Thus, the group $m=2$ includes only one mode—the $LP_{01}$ mode. The $LP_{01}$ mode can be viewed as both the lowest-order waveguide mode and the fundamental core mode. For many applications, the DCF 900 is designed such that its core carries a single mode and all modes other than the $LP_{01}$ mode have most of their energy in the cladding (i.e., these other modes are cladding modes).

The next group, $m=3$, contains also only one mode—the $LP_{11}$ cladding mode. The group $m=4$ has two cladding modes—$LP_{02}$ and $LP_{21}$. As further illustrated in FIG. 10, the group $m=5$ also has two cladding modes, the groups $m=6$ and $m=7$ have three cladding modes, the groups $m=8$ and $m=9$ have four cladding modes, the group $m=10$ has five cladding modes. The pattern continues for higher indices, m.

At steady-state (i.e., at a point in the fiber after the pump light has propagated through a length of fiber long enough that mode diffusion has substantially equilibrated the pump power between modes), the power is distributed substantially equally between mode groups; however, the power is not distributed equally between individual modes. All groups, including the core-mode group (or groups), carry nominally the same power $P_g = P_p/M$, where $P_p$ is the total pump power in the fiber at this point. As a consequence, the $LP_{01}$ mode, the only mode in the group $m=2$, carries a power $P_g$. The $LP_{11}$ mode, the only mode in the group $m=3$, also carries a power $P_g$. The group $m=4$ also carries a power $P_g$; however, the group $m=4$ has two modes ($LP_{21}$ and $LP_{02}$). Thus, each of the modes in the group $m=4$ carries a power $P_g/2$. For higher order groups having more modes in the groups, the power carried by the individual modes in the groups is lower.

A given cladding mode (of propagation constant $\beta_m^{cl}$) is coupled to a given core mode (of propagation constant $\beta_n^{co}$) when two conditions are met. The first condition is that propagation constant $\beta_n^{co}$ and the propagation constant $\beta_m^{cl}$, which are both functions of wavelength, are phase-matched. To phase-match the two modes at a particular wavelength, the period $\Lambda$ of the LPFG is appropriately selected. The period $\Lambda$ is defined by the following phase-matching condition:

$$\beta_m^{cl} - \beta_n^{co} = \frac{2\pi}{\Lambda} \tag{2}$$

For example, in a standard SMF-28 fiber, manufactured by Corning, Corning, N.Y., phase-matching and resultant coupling between the $LP_{08}$ mode and the $LP_{01}$ core mode occurs around a wavelength, $\lambda$, of 1530 nanometers using a LPFG with a period, $\Lambda$, of 530 micrometers (μm).

The second condition requires that the two modes to have the same azimuthal symmetry (i.e., the two modes must have the same azimuthal mode number l) for the case where the LPFG grooves are perpendicular to the fiber axis. This means that in embodiments utilizing a core carrying only the $LP_{01}$ mode, only $LP_{0q}$ cladding modes (e.g., $LP_{02}$, $LP_{03}$, $LP_{04}$, etc.) can be coupled to the core mode. Accordingly, while coupling from the $LP_{02}$ cladding mode into the $LP_{01}$ core mode is discussed above, other modes such as the $LP_{03}$, $LP_{04}$, $LP_{05}$, etc. can be coupled to the $LP_{01}$ core mode. The specific core and cladding modes that are described herein as being coupled should not be construed as limiting.

This condition that the two modes to have the same azimuthal symmetry does not apply if the grating is not perpendicular to the longitudinal axis of the fiber, such as is the case for a blazed grating. In the case where the grating is tilted, for example, the $LP_{11}$ mode can be coupled for example to the $LP_{01}$ mode. In contrast, when using a non-tilted grating, the overlap of the electrical fields caused by the perturbation of the grating is zero if the modes do not have the same azimuthal symmetry.

The reason for this second requirement can be seen by examining the following equation that governs the amount of power coupled by an LPFG from a cladding mode to a core mode as provided by T. Erdogan, *Cladding-mode resonances in short- and long-period fiber grating filters*, Journal of the Optical Society of America A, Vol. 14, No. 8, August 1997, pages 1760–1773:

$$\frac{P_m^{cl}}{P_n^{co}} = \frac{\sin^2\left[\kappa L_g \sqrt{1+\left(\frac{\delta}{\kappa}\right)^2}\right]}{1+\left(\frac{\delta}{\kappa}\right)^2} \tag{3}$$

where $L_g$ is the length of the grating and κ is the grating coupling coefficient for the two modes being considered, and δ is the detuning parameter. The grating coupling coefficient is assumed to be constant along the grating. The detuning parameter δ is defined by the following equation:

$$\delta = \frac{\beta_m^{cl} - \beta_p^{co} - 2\pi/\Lambda}{2} \tag{4}$$

The coupling coefficient κ is proportional to the spatial overlap integral between the electric fields of the two coupled modes. See, for example, T. Erdogan, *Cladding-mode resonances in short-and long-period fiber grating filters* (cited above). If the core and cladding modes have the same azimuthal symmetry, the integral is non-zero and coupling can take place. If the symmetries are different, the modes are orthogonal and the integral is exactly zero. Thus, κ is zero, and no power can be coupled between the two modes, even if the two modes are phase matched. Note that the coupling constant is proportional to the spatial overlap of both the fields and the refractive index perturbation and that if the grating is tilted with respect to the fiber axis (e.g., blazed), then the coupling is not necessarily zero if the spatial overlap of the modes is zero.

Because the mode groups all have a different $\beta_m^{cl}$, a particular LPFG 910 of period Λ can only phase-match one group of modes to a particular core mode in accordance with Equation 2. For example, the $LP_{02}$ mode can be matched to the $LP_{01}$ core mode and the $LP_{78}$ can be matched to the $LP_{73}$ core mode if the difference in propagation constant (Δβ) between the $LP_{02}$ and $LP_{01}$ mode and the difference in propagation constant (Δβ) between the $LP_{78}$ and $LP_{73}$ are substantially the same. Only one cladding mode can be matched to a given core mode with a given grating periodicity Λ. This is true for all index profiles. For a given pump wavelength and a given fiber that carries only the $LP_{01}$ core mode, the period Λ can be selected to phase-match any of the $LP_{0q}$ cladding modes to the $LP_{01}$ core mode. As shown in FIG. 10, these cladding modes belong to the groups m=2q. If the period Λ is selected to phase-match mode $LP_{0q}$, the power in that mode at point A is equal to the power in each group (which is $P_p$/M) divided by the number of modes in group 2q (which is q), i.e., $P_p$/M/q. In the case where power flows between the modes within the mode group, this power in the mode $LP_{0q}$ may change and more power may be coupled out of the mode group than $P_p$/M/q. Nevertheless, to maximize the power that can be coupled by a single LPFG into the $LP_{01}$ core, it may be advantageous to choose the lowest possible value of q (e.g. q=2), which is the $LP_{02}$ cladding mode. Coupling substantially all the $LP_{02}$ cladding mode power into the $LP_{01}$ core mode is accomplished by selecting the LPFG coupling length and coupling coefficient, as discussed below. Since all other $LP_{0q}$ modes potentially carry less power, using an LPFG designed to couple one of these other modes to the $LP_{01}$ mode may couple less power into the core. As indicated above, however, some power may be transferred between modes within the same mode group, in which case, the power may be more efficiently transfer out of the mode group by the LPFG.

When using the $LP_{02}$ cladding mode (assuming that the $LP_{21}$ does not communicate with the $LP_{02}$ mode), the maximum power coupled by the first LPFG 910 into the $LP_{01}$ core mode is $P_p$/2(M−1). The power remaining in the cladding is then $P_p−(P_p/2(M−1))$. The second LPFG 910 couples 1/(2(M−1)) of this amount, or $P_p(1−1/(2(M−1)))/2(M−1)$. After the nth LPFG 910, the minimum power remaining in the cladding is:

$$P_p(n) = \left(1 - \frac{1}{2(M-1)}\right)^n P_p \qquad (5)$$

For a single-mode core, the number of LPFGs 910 required to couple substantially all the pump power into the core is therefore roughly of the order of 2(M−1) assuming no transfer of optical power between modes within the mode group. As indicated above, in the case where light is transferred between the modes in the group, the amount of light coupled out of the mode group increases. For example, light from the $LP_{21}$ mode may be transferred to the $LP_{02}$ mode and coupled to the $LP_{01}$ mode using the LPFG. In this case where optical power coupled out of the $LP_{02}$ mode is replenished by light from the $LP_{21}$ mode, the maximum power coupled, for example, by the first LPFG 910 into the $LP_{01}$ core mode is greater than $P_p$/2(M−1) and may be increased, e.g., to $P_p$/(M−1). Accordingly, as a result of mode degeneracy, the power couple may be for example between about $P_p$/k(M−1) and $P_p$/(M−1) for a cladding mode group having k modes.

The operation of the DCF 900 with the plurality of LPFGs 910 is as follows. As discussed above, the configurations of the LPFGs 910 are preferably selected to couple the $LP_{0q}$ cladding modes to the $LP_{01}$ mode. In general, at the input (point A) of each LPFG 910, pump light is present in both the $LP_{0q}$ mode (largely due to diffusion) and the $LP_{01}$ mode (residual power unabsorbed by the dopant). The LPFG couples pump light not only from the $LP_{0q}$ cladding mode to the $LP_{01}$ core mode, but also from the $LP_{01}$ core mode to the $LP_{0q}$ cladding mode. Hence, the remaining core mode power at point A tends to be coupled out of the core into the cladding, which is undesirable. These two opposite coupling processes are not independent. The net direction of power flow at each LPFG (i.e., whether more power is coupled from the cladding to the core (i.e., the desirable direction) or from the core to the cladding (i.e., the undesirable direction) depends on the relative power carried by the two modes at point A. The relative phase of the two modes at point A will influence the output phases of the fields. The relative phase depends strongly on a number of variables that cannot be easily controlled, such as the fiber temperature, temperature gradients, stresses, static and dynamic pressure, and the like. Therefore, the relative phase is a random variable between 0 and 2π.

One aspect of embodiments in accordance with the present invention is a method that reduces or minimizes this undesirable dependence of the coupled power on the relative phase of the modes. This goal is accomplished by satisfying two conditions. To met a first condition, the method comprises selecting the spacing between the LPFGs 910 and selecting the pump absorption such that at point A of each LPFG 910 more pump power is in the cladding mode of interest than in the core mode, as discussed below. To satisfy a second condition, the method comprises selecting a coupling coefficient κ such that $κL_g=π/2$ (see Equation 3) to provide phase insensitivity and to cause the LPFG 910 to couple substantially 100% of the power at point A as the light propagates to point B. The second condition assures that the power remaining in the core at point A ($P_{core}$) is fully coupled into the cladding at point B, and also assures that the power in the cladding mode of interest at point A ($P_{clad}$) is fully coupled into the core at point B. If $P_{clad}$ is greater than $P_{core}$ in accordance with the first condition, more power is coupled into the core than is coupled out of the core. Thus, each LPFG 910 increases the net power in the core at point B by an amount equal to $P_{clad}−P_{core}$.

The optimum spacing between the LPFGs 910 depends on several design parameters, such as, for example, the rate of diffusion between cladding modes (discussed below) and the type of laser transition involved in the dopant. As indicated above, the unabsorbed pump power remaining in the core at point A should be smaller than the pump power in the cladding mode of interest at point A. The unabsorbed pump power remaining in the core depends on how much power is in the core at point B of the previous LPFG and depends on the rate of pump absorption in the core. The rate of pump absorption in the core depends on the dopant, the dopant concentration, the pump wavelength, and the pump intensity in the core, in addition to other parameters. The unabsorbed pump power remaining in the core also depends on the length of fiber $L_s$ between adjacent LPFGs 910 and on the amount of power diffused into the core mode along the length of fiber separating two adjacent LPFGs 910. The pump power in the cladding mode of interest depends on how much pump power is in the cladding at point B of the previous LPFG, depends on the rate of diffusion between cladding modes (discussed below), and depends on $L_s$. A longer $L_s$ results in less power remaining in the core unless mode diffusion replenishes the core mode faster than the core mode is absorbed by the dopant. A longer $L_s$ thus results in more power in the cladding mode of interest. The optimum value for $L_s$ can be either calculated or measured experimentally.

The limiting case of the first condition discussed above is to select the spacing between LPFGs 910 such that no pump power remains in the core at the point A (i.e., $P_{core}=0$). In this case, the power transferred to the core ($P_{clad}-P_{core}$) by the LPFG 910 is maximized. In the region of the fiber just to the left of point A in FIG. 9, the low pump power means that the laser ions are poorly inverted. This is acceptable for a laser ion that does not exhibit ground-state absorption (GSA), such as a four-level transition laser ion, since ions in the ground state do not induce absorption loss on the signal. This method can advantageously be used, for example, with the 1.06-micron transition of $Nd^{3+}$.

For a laser ion that exhibits GSA, such as a three-level transition laser ion, in the region of the fiber just to the left of point A in FIG. 9, ions in the ground state absorb the signal and therefore introduce an undesirable signal loss. A sufficiently high population inversion should be maintained in that region to assure that a signal traveling through this region experiences close to zero GSA, or even better, experiences some gain. This goal can be advantageously accomplished in three ways.

One method of maintaining a sufficient population inversion is to select the spacing between adjacent LPFGs 910 such that sufficient pump power remains in the core in that region to create the necessary population inversion. The spacing is advantageously selected by using standard laser rate equations or by using commercially available optical fiber amplifier simulators (e.g., simulators for $Er^{3+}$) to calculate the gain per unit length at every point along the DCF 900. The LPFG spacing is adjusted until the gain is positive everywhere. If all positive gain cannot be achieved, the LPFG spacing is adjusted for minimal negative gains (e.g., minimal attenuations).

A second method for maintaining a sufficiently high population inversion is to select an input pump power high enough that sufficient pump power remains to the left of point A to create the population inversion required to minimize or even cancel signal GSA loss.

Figure 11:
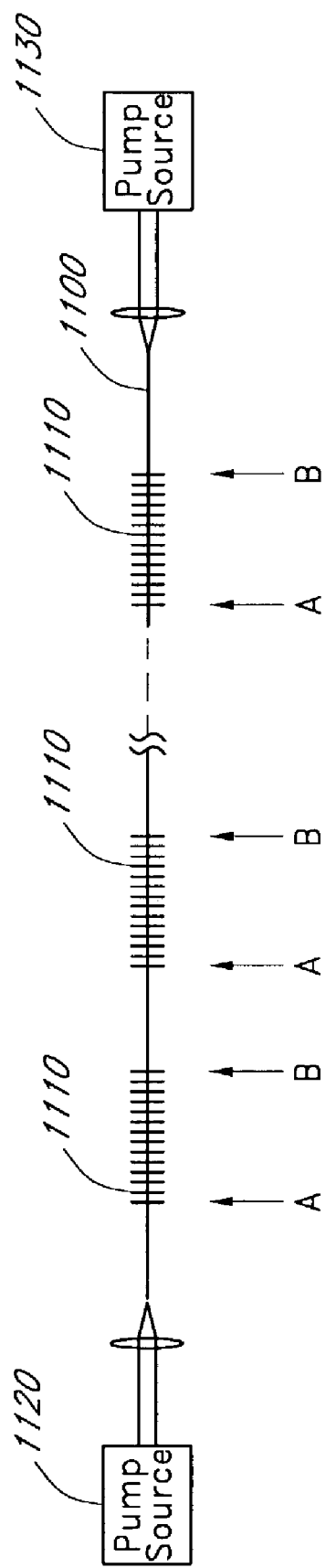
FIG. 11 schematically illustrates a further embodiment of a double-clad fiber with a plurality of long-period fiber gratings mounted thereon wherein the fiber is bidirectionally pumped from two pump sources.

A third method is illustrated by a DCF 1100 in FIG. 11 having a plurality of LPFGs 1110. The DCF 1100 is pumped bidirectionally from a first pump source 1120 and from a second pump source 1130. Since each LPFG 1110 operates simultaneously in both directions, each LPFG 1110 also couples the backward pump power propagating from point B toward point A into the core. As a result of the backward pump power traveling from right to left at point A, pump power will be present to the left of point A.

Each of the three methods is used advantageously, for example, with the $^4I_{13/2} \rightarrow ^4I_{15/2}$ transition of $Er^{3+}$ or for the $^2F_{5/2} \rightarrow ^2F_{7/2}$ transition of $Yb_{3+}$.

The mode diffusion length $L_d$ is the length of fiber required to replenish the depleted cladding mode of interest to $1-(1/e)$ (approximately 63%) of its steady-state power. After two diffusion lengths ($2L_d$), the cladding mode power is replenished to $1-(1/e^2)$ (approximately 86%) of its steady-state value. Additional diffusion lengths replenish the cladding mode power further. Measured $L_d$ values as short as 10–20 cm have been reported. See, for example, D. Gloge, *Optical power flow in multimode fibers* (cited above).

Based on the foregoing discussion, the LPFGs 910 can be separated by a few diffusion lengths (e.g., two to three or more diffusion lengths) for a DCF 900 having a core doped with a laser ion that exhibits no signal GSA. For a DCF 900 having a core doped with a laser ion that exhibits signal GSA, the LPFGs 910 are advantageously separated by a shorter distance (e.g., only one or two diffusion lengths). Alternatively, the DCF 1100 device can advantageously be bidirectionally pumped using two sources 1120, 1130, as illustrated in FIG. 11. As a further alternative, shorter spacing and bidirectional pumping can both be used. The optimum numerical value of the optimum spacing depends on a large number of system parameters and can be advantageously determined using known modeling techniques, by experimentation, or by a combination of modeling and experimentation.

The mode diffusion length $L_d$ depends on the mode numbers, the pump wavelength, and the magnitude and spatial frequency spectrum of the fiber index profile perturbations. Since the pump mode and wavelength are generally set by other constraints (some of which were discussed above), the main parameters that are advantageously adjusted in practice to control the diffusion length are the magnitude and the frequency spectrum of the waveguide perturbations. Measured $L_d$ values from on the order of 4–5 centimeters or shorter to many meters have been reported. See, for example, D. Gloge, *Optical power flow in multimode fibers* (cited above), and M. E. Fermann, *Single-mode excitation of multimode fibers with ultrashort pulses* (cited above). The wide range in the values of $L_d$ is a direct consequence of variations in the magnitude and the frequency of the fiber index profile perturbations. In certain embodiments in accordance with aspects of the present invention, the mode diffusion length $L_d$ is adjusted to a desired value by selection of parameters of the double-clad fiber.

One benefit of embodiments in accordance with aspects of the present invention is the minimization of the length of a cladding-pumped DCF device. The required DCF length depends on the fiber absorption length, the mode diffusion length, and the grating length. The spacing between LPFGs is also a significant length parameter; however, the spacing is preferably scaled in accordance with the mode diffusion length $L_d$. Thus, the spacing is not an independent parameter. Most laser dopants have a relatively small absorption at the pump wavelength for pump light guided in the core (of the order of 30 dB per meter or less for a low pump power and much less for a practical, high pump power). For pump light guided in the cladding, the absorption is even weaker (e.g., by a factor in the range of 5–50, depending on the pump power level and depending on the ratio R between the core area and the cladding area, as discussed below). The minimum DCF length is thus set mostly by the rate of pump absorption.

The rate of pump absorption is characterized by the pump absorption length, which is the length required to absorb $1-(1/e)$ of the pump power. The pump absorption length is limited by the maximum laser ion concentration that can be achieved in the core. For example, when the dopant is a rare-earth ion, too high a concentration leads to undesirable energy transfer mechanisms between ions that spoil the efficiency of the ions as laser medium. In a core-pumped fiber, the absorption length at high pump power is typically one to a few meters, so that the fiber needs to be in the range of a few meters to a few tens of meters. The next strongest parameter is the mode diffusion length, which can be as short as 10–20 centimeters. The next shortest and also the last of the length characteristics is the coupling length of a typical LPFG, i.e., the length required to achieve 100% coupling, which is typically on the order of 2 centimeters.

In general, a shorter diffusion length allows the LPFGs to be more closely spaced so that a shorter device (e.g., a shorter DCF length) can be produced. A minimum DCF length of a few high-power absorption lengths would be obtained if all of the pump power could be launched into the core of the DCF; however, as discussed above, the low spatial coherence and low brightness of large area high-power multimode laser diode pump sources generally precludes launching efficiently into the core. Accordingly, in embodiments in accordance with aspects of the present invention, the DCF is cladding-pumped. The length of the DCF needed to absorb most of the launched pump power depends on the spatial overlap between the pump light and the doped core, which depends on the ratio of the inner cladding area to the core area. The length of the DCF would be many times longer in the absence of the LPFGs described herein, which couple pump light from the cladding to the core and thereby increase the rate of pump absorption.

Figure 12:
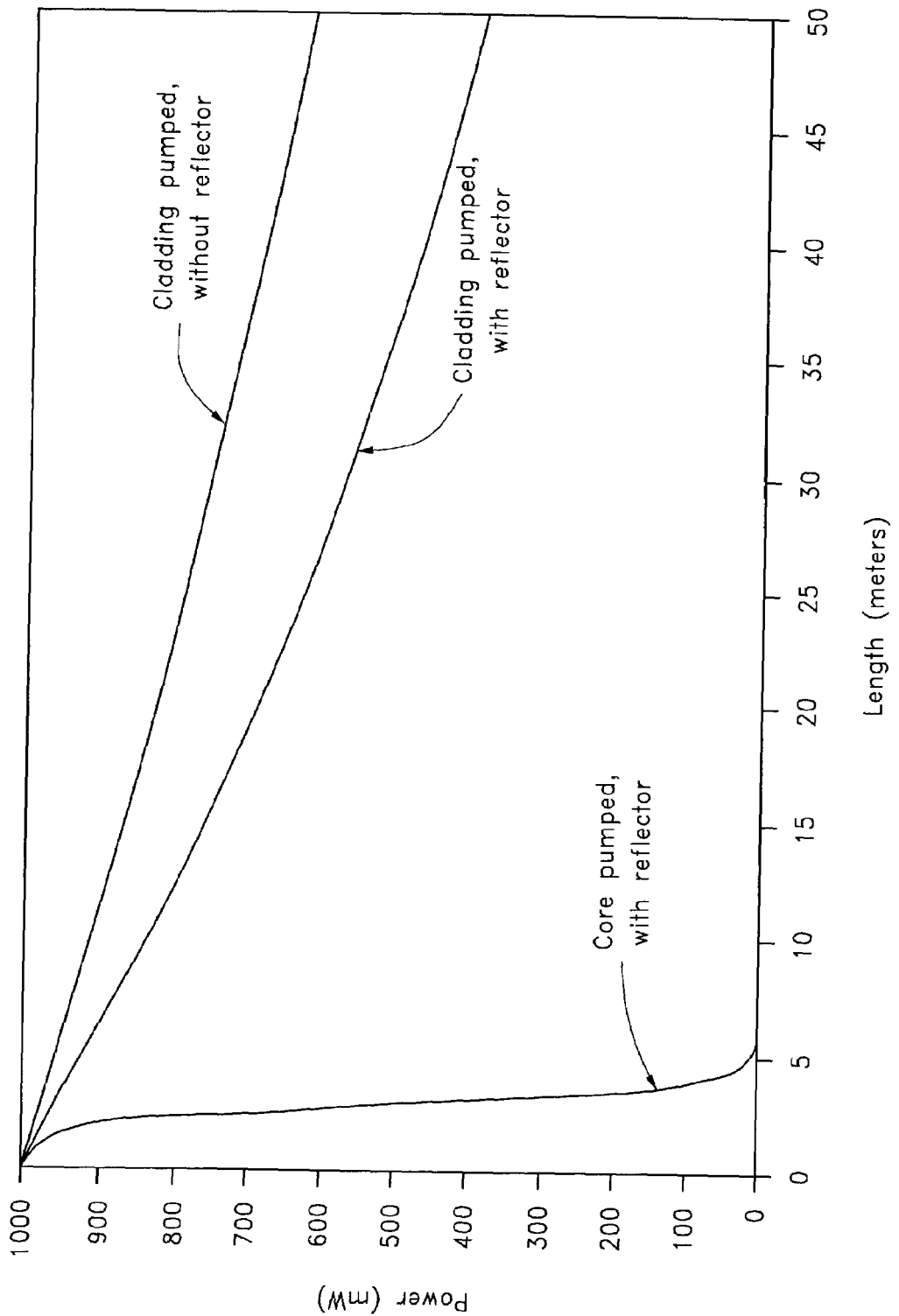
FIG. 12 graphically illustrates the results of simulations of the pump power remaining in an Er-doped double-clad fiber as a function of fiber length.

The foregoing points are illustrated in FIG. 12, which presents the results of simulations of the pump power at 980 nanometers remaining in an Er-doped DCF as a function of fiber length. In the illustrated example, the inner cladding area is 400 times larger than the core area and the input power is 1 watt. The absorption of the fiber is 7.7 dB per meter for the core mode. Pump saturation effects are taken into account in the simulations.

If all the pump power is launched into the core of the DCF and if a highly efficient pump reflector is placed at the far end of the DCF to reflect unabsorbed pump power backward along the core, substantially all of the pump power would be absorbed after about 5 meters. Conversely, if the pump power is launched into the cladding and no reflector is used, only about 38% of the pump is absorbed even after propagating in 50 meters of fiber. If a reflector is added at the far end of the DCF, the absorption improves to about 62%; however, this is still very weak absorption. FIG. 12 shows that in the core-coupled DCF, the same pump absorption of 62% is achieved after a length of only about 3 meters, or about one-seventeenth the length required when the power is coupled to the cladding. This absorption is used for comparison when describing the benefits of embodiments of the present invention.

The graphs in FIG. 12 provide a numerical example for the improvement that can be advantageously achieved by embodiments in accordance with aspects of the present invention. In particular, in the limit of extremely short LPFGs (e.g., LPFGs much shorter than the core absorption length), a cladding-pumped DCF used with a series of LPFGs behaves asymptotically like the same DCF pumped in the core. The foregoing examples are presented herein as illustrations rather than as best possible scenarios in order to show that embodiments in accordance with aspects of the present invention allow the DCF length to be reduced. In some embodiments, the fiber length may be reduced by a factor of about 17 or more.

Substantial improvement in the performance of a DCF using LPFGs is achieved when the DCF has a diffusion length $L_d$ much shorter than the LPFG length $L_g$. In the limit of $L_d$<<$L_g$, a preferred embodiment advantageously comprises a series of many (e.g., 10–100) LPFGs that couple 100% of the power. The LPFGs are placed next to each other along the DCF. The effects of the LPFGs combine to couple most of the pump power into the core. The combined length of the LPFGs is 10–100 times the length of a typical LPFG length. For example, for LPFGs having individual lengths of approximately 2 centimeters, the combined length of 100 LPFGs is approximately 2 meters. In this embodiment, all the pump power is coupled into the core mode over a DCF length of approximately 2 meters or less. This DCF length may or may not be sufficient for the pump power to be absorbed by the core dopants. Therefore, the portion of the DCF downstream from the series of LPFGs, which behaves like a core-pumped fiber, is advantageously constructed to be long enough to absorb the required fraction of remaining pump power. In other words, the total DCF length, including the portions of fiber under the LPFGs, must be a few high-power absorption lengths long. This configuration therefore requires nominally the same length of DCF as the same DCF pumped in the core. Thus, an ideal short-length design for a core-pumped DCF can be asymptotically reached by embodiments in accordance with the above-described aspects of the present invention by selecting a DCF with a very short diffusion length (e.g., by selecting a diffusion length $L_d$ much shorter than the grating length ($L_d$<<$L_g$), which is less than approximately 2 centimeters). In certain embodiments, this configuration can be implemented with fewer gratings of longer length that effectively combine smaller gratings together into one or more larger gratings.

Figure 13A:
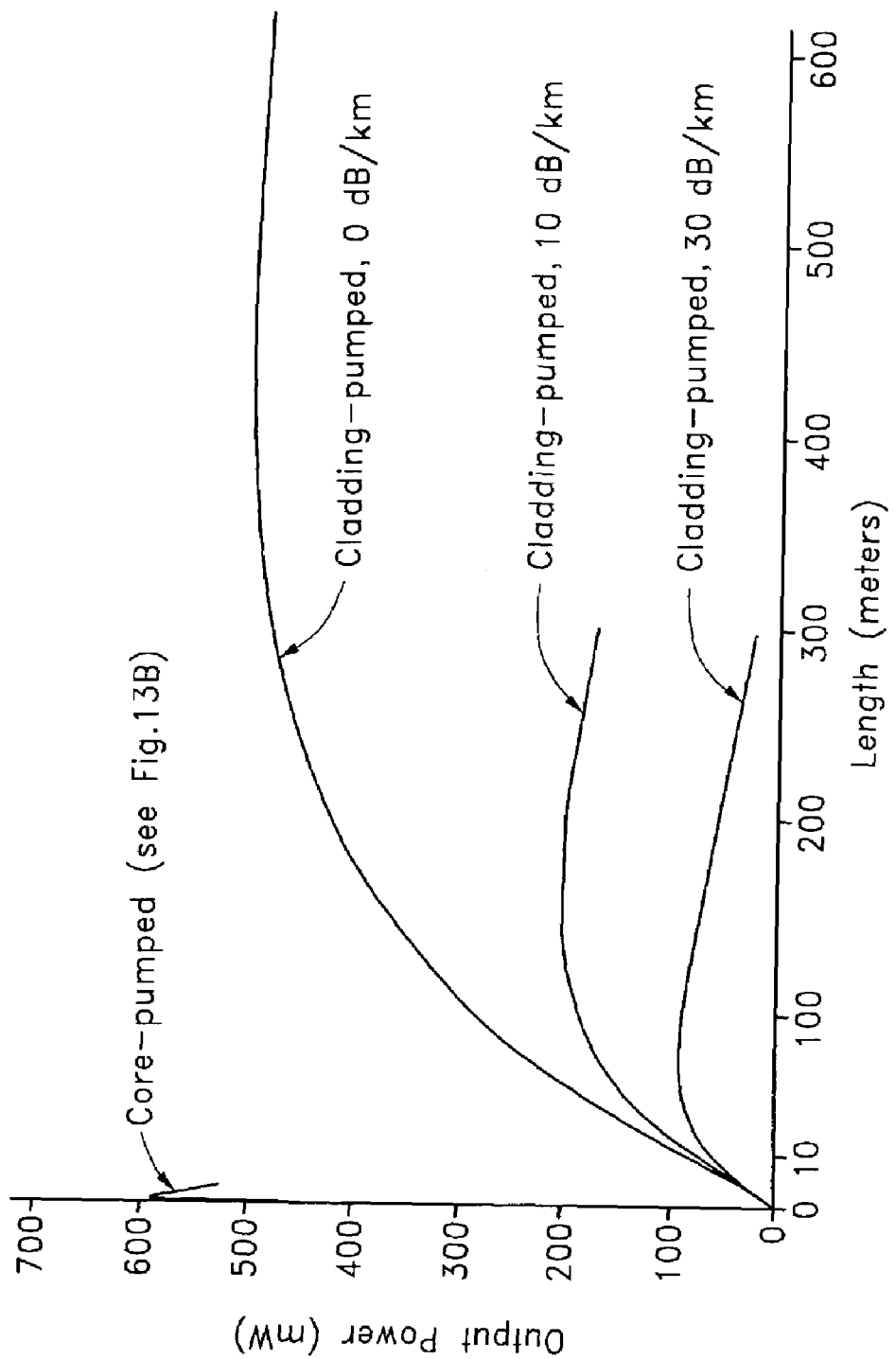
FIG. 13A graphically illustrates the output power of a 1530-nanometer Er-doped fiber laser as a function of the length of double-clad fiber for a core-pumped configuration and for three cladding-pumped configurations having different cladding loss characteristics.
Figure 13B:
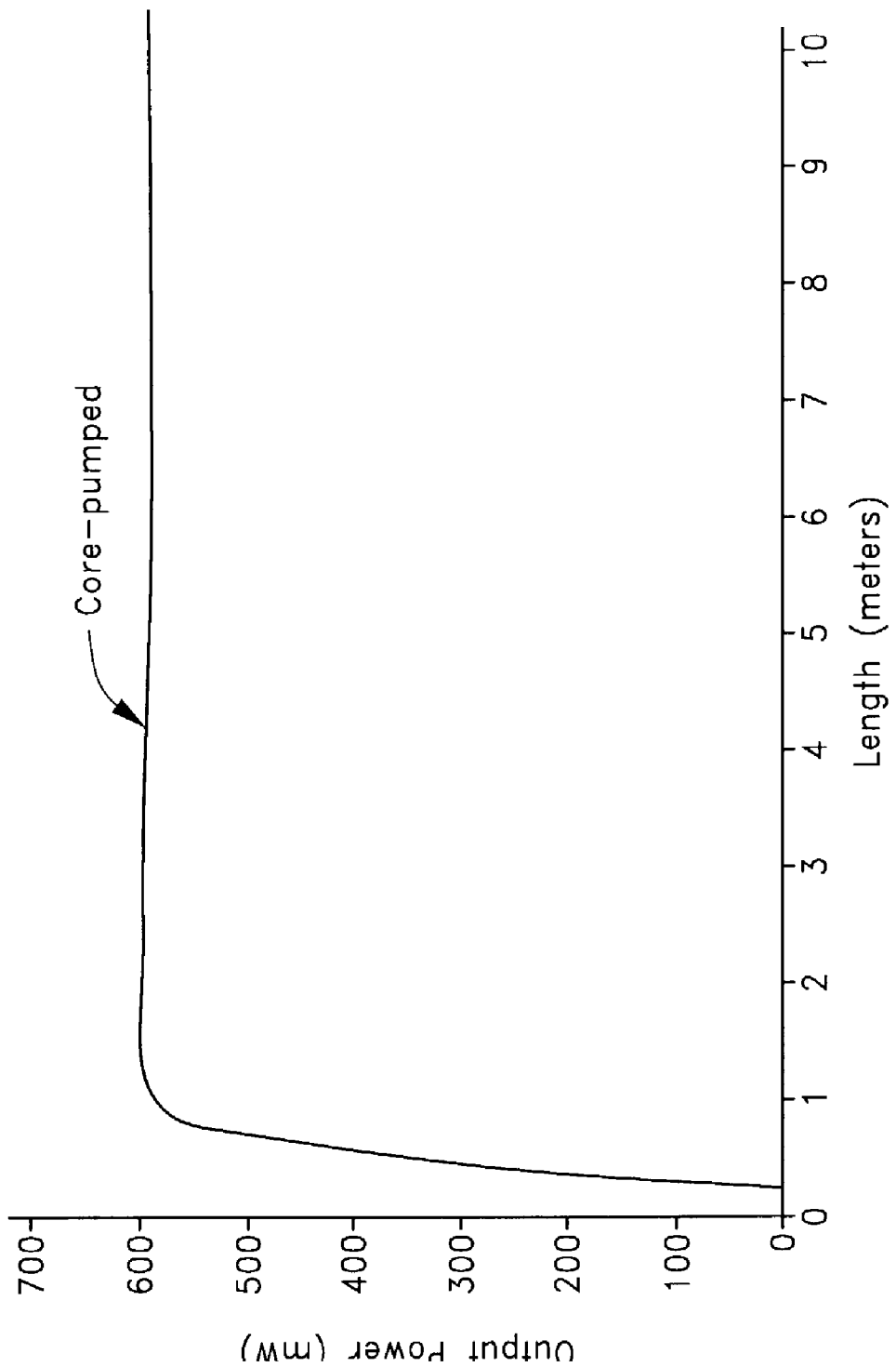
FIG. 13B illustrates the output power of the core pumped configuration plotted in FIG. 13A but on an expanded horizontal scale to show more detail.

Output power can be increased along with the reduction in fiber length by using LPFGs, as illustrated in FIG. 13A and FIG. 13B. FIGS. 13A and 13B show the output power of a 1530-nanometer Er-doped fiber laser as a function of fiber length. The fiber laser is made with the same DCF as described above in connection with FIG. 12. The DCF is pumped with 1 watt of pump power at a wavelength of 980 nanometers. The fiber loss for a core mode (signal and pump) is 30 dB per kilometer. When the pump power is launched in the core (as illustrated by the leftmost curve of FIG. 13A), which is plotted on an exploded horizontal axis in FIG. 13B, the fiber laser output power is maximum for a length of about 1.3 meters, and the maximum output power is about 600 milliwatts. When the pump power is launched in the cladding, a considerably longer fiber is required for the fiber laser to reach its maximum output power, and this maximum output power is lower. For a cladding mode loss of 0 dB per kilometer, this maximum output power is about 500 milliwatts, and the maximum output power occurs with about 450 meters of DCF. The maximum fiber laser output power decreases rapidly as the cladding mode loss is increased to 10 dB per kilometer, which may be a reasonable value for a practical DCF. Again, in embodiments in accordance with aspects of the present invention that include LPFGs for coupling of optical power from the cladding into the core, the maximum performance of a cladding pumped DCF is nominally the same as if the DCF was core pumped. As show in FIGS. 13A and 13B, therefore, the embodiments in accordance with aspects of the present invention that advantageously employ one or more LPFG may reduce the fiber laser length from around 200 meters to about 1.3 meters (e.g., by a factor of about 150) and increase the fiber laser output power by anywhere from 20% to 300% or more, depending on the cladding mode loss. Other performance specification of the systems described herein may be larger or smaller depending on the particular configuration.

Figure 14:
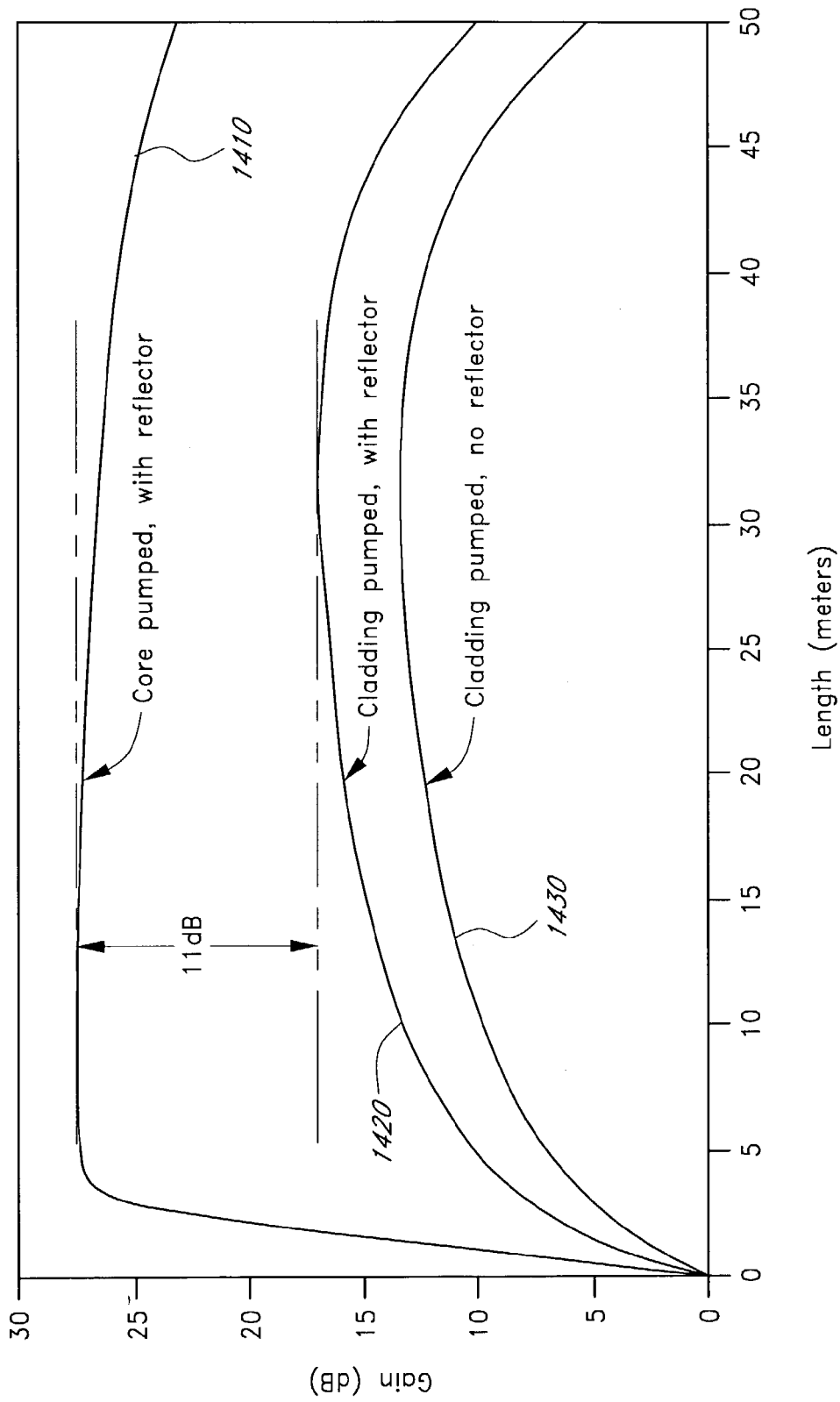
FIG. 14 graphically illustrates the gains of three double-clad fiber amplifiers having different combinations of pump injection with some of the amplifiers including reflectors for recycling the pump light through the fiber.

Another example of the improvements achieved by embodiments in accordance with aspects of the present invention are illustrated in FIG. 14. In FIG. 14, the gains of three DCF amplifiers are plotted. Each amplifier is made with the same fiber. In a first amplifier, which has the gain characteristics plotted by the upper graph 1410, the core of the fiber is pumped, and a pump reflector is placed at the far end of the fiber. In a second amplifier, which has the gain characteristics plotted by the middle graph 1420, the cladding of the fiber is pumped and a reflector is provided at the far end of the fiber. In a third amplifier, which has the gain characteristics plotted by the lower graph 1430, the cladding of the fiber is pumped and no reflector is provided. As expected, the best performance is that of the core-pumped amplifier. By coupling light from the cladding modes into the core modes, the performance of the cladding pumped amplifier can be made to more closely resemble the performance of the core-pumped amplifier. As shown by FIG. 14, if coupling of light from the cladding modes into the core mode enables the performance of the core-pumped amplifier to be substantially replicated, the gain improvement enabled may be about 11 dB, while the DCF length is reduced from 32 meters to 2 meters, a factor of 16.

Another group of embodiments of this invention benefits from the use of a cladding with a parabolic-index profile. As an approximation, each mode group has a different propagation constant $\beta_m^{cl}$, which is proportional to the effective refractive index for the mode group. For a standard, step-index profile fiber, the difference between the of propagation constants of adjacent mode groups, $\Delta\beta = \beta_m^{cl} - \beta_{m-1}^{cl}$, is a function of m. This property is illustrated in FIGS. 15A–15C, which plot the effective index of the modes in all the mode groups versus the mode group number m for three fiber configurations shown in FIGS. 16A–16C.

Figure 15B:
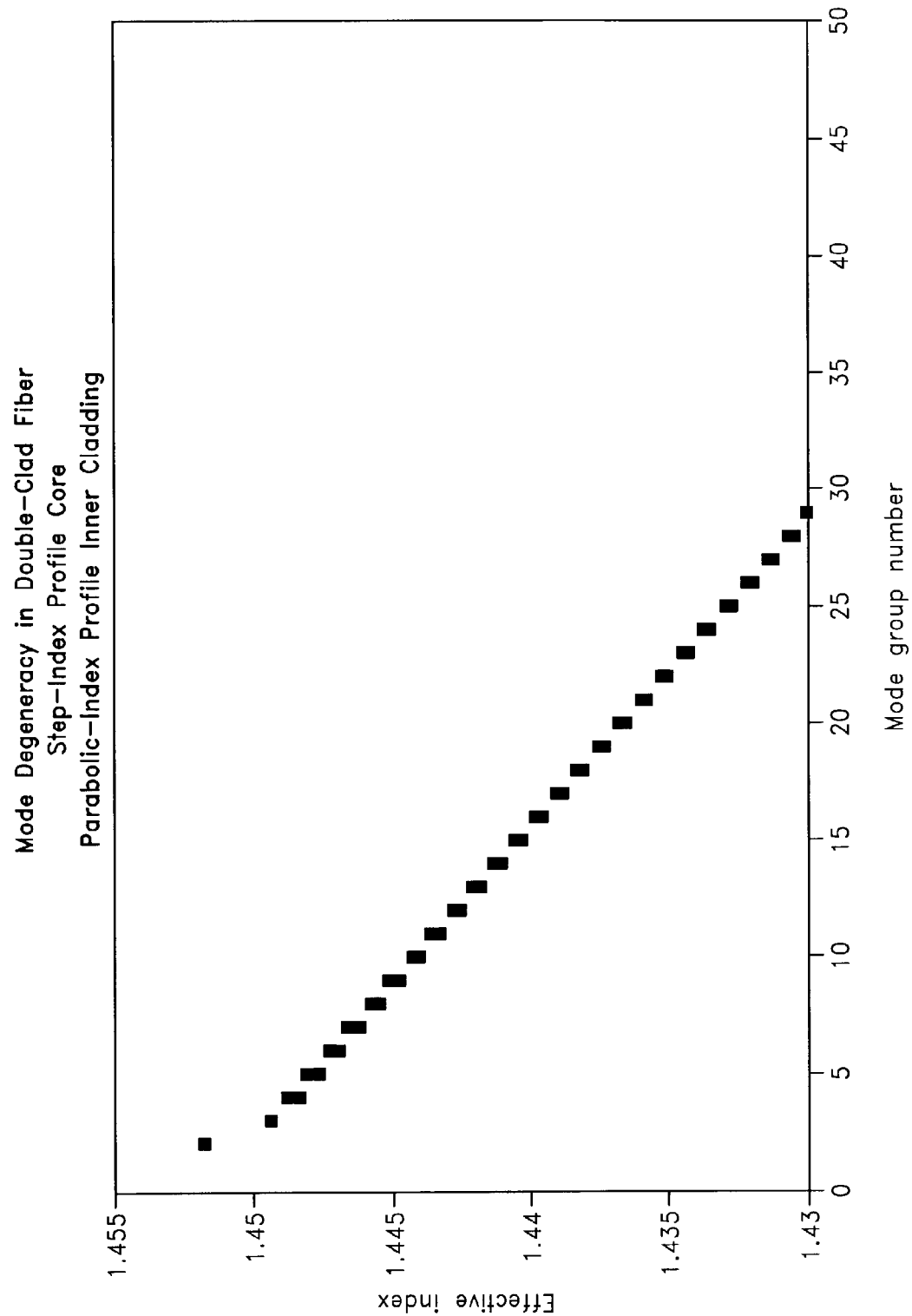
FIG. 15B illustrates plots of the effective index of the modes in the mode groups versus the mode group number m for a second double-clad fiber that has a core having a step-index profile and that has an inner cladding having a parabolic-index profile (square-shaped symbols)
Figure 16A:
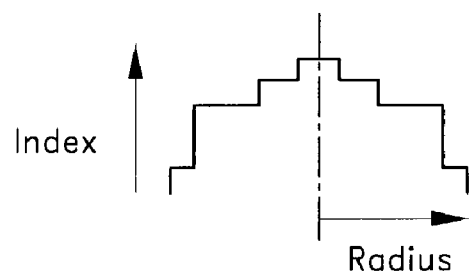
FIG. 16A illustrates the index profile for a double-clad fiber having a core and an inner cladding with respective step index profiles.

The plots with diamond symbols in FIG. 15A represent the effective indices of a standard fiber that has a core with a step-index profile and that has an inner cladding with a step-index profile as shown in FIG. 16A. Note that as the mode group number increases, the differences between the indices of the individual modes within each group become larger and the limits of the approximation referred to above are manifested for this fiber configuration.

Figure 16B:
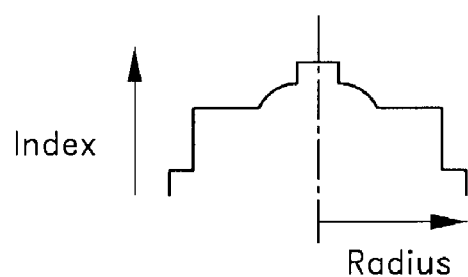
FIG. 16B illustrates the index profile for a double-clad fiber having an inner cladding with a parabolic index profile and having a core with a step index profile.

The plot with square symbols in FIG. 15B represents the effective indices of a fiber that has a core with a step-index profile and that has an inner cladding that has a parabolic index profile as shown in FIG. 16B.

Figure 16C:
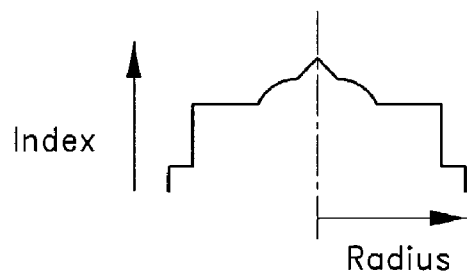
FIG. 16C illustrates the index profile of a double-clad fiber having an inner cladding with a parabolic index profile and having a core with a triangular index profile.

The plot with triangular symbols in FIG. 15C represents the effective indices of a fiber having a core with a triangular-index profile and an inner cladding with a parabolic index profile as shown in FIG. 16C.

For all the fibers plotted in FIGS. 15A–15C, the core radius is 3 microns, the core numerical aperture is 0.11, the inner cladding radius is 35 microns, the inner cladding numerical aperture is 0.24, and the outer cladding diameter is 125 microns. As illustrated by the diamond-shaped symbols in FIG. 15A, the propagation constant differences between adjacent mode groups for the standard step-index inner-cladding fiber are not constant. Instead, $\Delta\beta$ increases as m increases. Consequently, an LPFG selected to have a period that phase-matches a given mode group m−2 to a mode group m will not have the correct period to couple other mode groups together. As a consequence, efficient mode diffusion along the DCF will require a DCF with a broad range of index profile perturbation periods, which generally requires a rather long diffusion length.

In contrast, the plot of the square-shaped symbols in FIG. 15B shows that for the parabolic-cladding fiber with a step-index core, the difference $\Delta\beta$ is almost independent of m, except for m=2 (as represented by the square symbol between an effective index of 1.45 and 1.455). Furthermore, all modes within a given group have approximately the same effective index. The plot of the triangle-shaped symbol in FIG. 15C shows that for the parabolic-cladding fiber with a triangular-index core, $\Delta\beta$ is almost independent of m even for m=2. Thus, phase-matching can be achieved over a broader range of mode groups.

The property illustrated by FIGS. 15A–15C is exploited by aspects of the present invention to reduce the diffusion length substantially. In a first of four examples, the DCF has an inner-cladding with a parabolic index profile so that the DCF mode diffusion length is much shorter than the mode diffusion length of other profiles (e.g., step-index). The first example does not use LPFGs. The shorter diffusion length causes mode mixing to occur over shorter distances. Hence, the rate of pump absorption by the dopant is increased, and a shorter DCF can be used.

A second example does utilize LPFGs in combination with the parabolic index profile. The LPFGs increase the coupling of light from the cladding into the core. In the second example, the minimum distance between adjacent LPFGs is substantially shortened because, as discussed above, the mode diffusion length is shortened. As a result, the spacing between adjacent LPFGs can be reduced, preferably to the limit imposed by pump absorption in the core wherein $L_{abs}$ determines the spacing between the LPFGs (i.e., $L_{abs} > L_d$).

In a third example, an additional LPFG is used to efficiently couple all cladding modes together. This speeds up the mode diffusion and reduces the fiber length needed to equalize the power between cladding-mode groups. The period $\Lambda'$ of the additional LPFG is determined by:

$$\frac{2\pi}{\Lambda'} = |\beta_m^{cl} - \beta_{m-1}^{cl}| \quad (6)$$

where m can be any of the group mode indices supported by the DCF. In other words, $\Lambda'$ is independent of m, (i.e., the same grating couples may preferably substantially all the mode groups together). Note that in general, the period $\Lambda'$ is different from the period $\Lambda$ of the LPFGs used to couple a particular cladding mode to the core mode, so that two distinct series of LPFGs are involved. Alternatively, to average out the small spread in the differences $\beta_m^{cl} - \beta_{m-1}^{cl}$ as a function of m, the period $\Lambda'$ can be chosen to be equal to $<|\beta_m^{cl} - \beta_{m-1}^{cl}|>$, i.e., the average of the differences $\beta_m^{cl} - \beta_{m-1}^{cl}$ calculated over all the values of m, between 2 and M. As another alternative, the average can be calculated over a few lower order mode group, which may carry more power.

Figure 17:
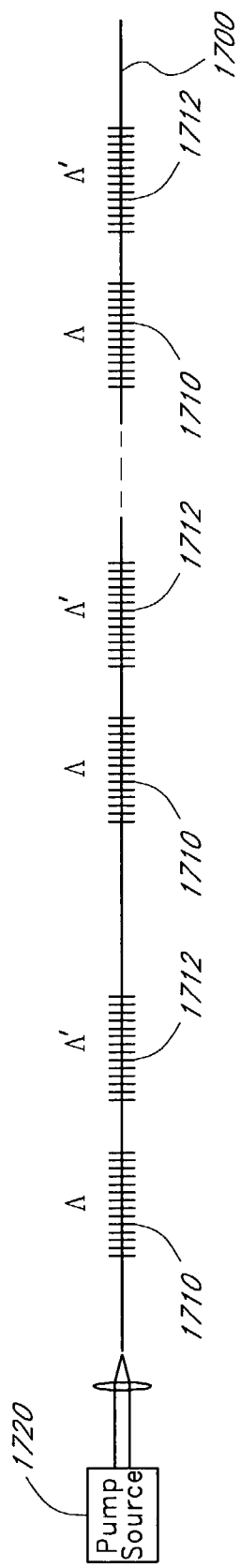
FIG. 17 schematically illustrates a system that comprises a double-clad fiber onto which are positioned at least a first long-period fiber grating having a first period for coupling cladding mode into a core mode and a second long-period fiber grating having a second period selected to equalize the power between cladding-mode groups.

In this embodiment, illustrated in FIG. 17, a DCF 1700 optically coupled to a source 1720 has a first LPFG 1710 of period $\Lambda$. A second LPFG 1712 of period $\Lambda'$ is inserted on the DCF after each $LP_{0q} \rightarrow LP_{01}$ LPFG 1710. The first LPFG (period $\Lambda$) 1710 couples the power in the $LP_{0q}$ cladding mode to the $LP_{01}$ core mode. The second LPFG (period $\Lambda'$) 1712 equalizes the power between cladding-mode groups (i.e., the second LPFG 1712 replenishes the $LP_{0q}$ mode power). Along the length of DCF downstream from this LPFG pair 1710, 1712, the laser ions in the core absorb the power in the $LP_{01}$ core mode. This sequence is repeated a number of times, until the desired fraction of pump power is absorbed by the dopant.

The configuration in the third example can be further simplified in a fourth example by selecting a fiber core in such a way that a single grating can perform the functions of these two individual LPFGs 1710, 1712. By reducing the number of LPFGs by a factor of two, the fourth example advantageously reduces the insertion loss introduced by the LPFGs. The fourth example preferably is not implemented with a step-index core profile because, as seen in FIG. 15A, $\beta_m^{cl} - \beta_{m-1}^{cl} \neq \beta_2^{cl} - \beta_1^{co}$, and thus the same period does not effectively couple the $LP_{02}$ cladding mode to the $LP_{01}$ core mode and also couple adjacent cladding modes groups together. However, by using a cladding with a parabolic index profile and a core with a triangular index profile, as pointed out earlier in relation to FIG. 15C, $\beta_m^{cl} - \beta_{m-1}^{cl}$ is very nearly constant for all the mode groups, including the core mode $LP_{01}$ (m=2). The differences between the effective indices of adjacent mode groups are not exactly equal, but they are so close that all mode groups are strongly coupled with a single grating of fixed period. For example, for the fiber with a triangular index-profile core of FIG. 15C, the maximum spread between the effective indices of all the mode groups is only about 3%. Thus, all the mode groups fall within the bandwidth of low-loss LPFGs, which have a typical 3-dB bandwidth of about 3% to 4%. The fourth example thus comprises a series of identical LPFGs spaced by a length determined primarily by the absorption strength of the laser ions. Stated differently, in a triangular-core fiber, a single LPFG can be fabricated with a period $\Lambda=\Lambda'$, such that the LPFG couples adjacent mode groups between themselves and couples the $LP_{0q}$ cladding mode to the $LP_{01}$ core mode.

Another advantage of a parabolic-profile inner cladding is that the number of modes supported by the inner cladding is lower, by a factor of 2, compared to a step-index profile inner cladding with the same diameter and peak index difference (approximately $(V_{clad})^2/4$ versus approximately $(V_{clad})^2/2$, where $V_{clad}$ is the V number of the inner cladding). The V number, or normalized frequency, of the fiber inner cladding is defined as $$V = \frac{2\pi a}{\lambda}\sqrt{n_{in}^2 - n_{out}^2}$$

where a is the inner cladding radius, $\lambda$ is the pump wavelength, $n_{in}$ is the refractive index of the inner cladding and $n_{in}$ is the refractive index of the inner cladding. Thus, for a given pump power launched into the fiber, the power per mode is multiplied by approximately two in a parabolic-profile inner-cladding DCF compared to a step-index inner-cladding DCF. The absolute pump power coupled per LPFG is also multiplied by the same factor. Hence, the number of LPFGs required to couple a given fraction of launched pump power is decreased by approximately a factor of two.

Another advantage of a parabolic-profile inner cladding is that it increases the optical confinement of the cladding modes. As a result, for most of the cladding modes the electric field in the core is larger than for a step-index profile (i.e., the fractional modal power in the core is higher). This has two beneficial consequences. First, the absorption rate of a given cladding mode is higher. One embodiment in accordance with aspects of the present invention, which does not utilize LPFGs, is a DCF with a parabolic-profile inner cladding in which pump power is launched by standard means (e.g., by coupling into the end or the sides of the cladding). The rate of pump absorption is then substantially increased compared to that of a standard DCF with a step-index inner cladding with the same diameter and NA, and excited under the same conditions. As an example, in a fiber with a core diameter of 8 microns and a numerical aperture of 0.1, with an inner cladding diameter of 58 microns and a numerical aperture of 0.17, and with an outer cladding diameter of 125 microns, the calculated increase in absorption coefficient averaged over all the modes (cladding modes and core modes) is about a factor of 2.

A second benefit of this stronger confinement is that the coupling coefficient $\kappa$ of an LPFG made in a fiber with a parabolic inner cladding profile is also increased compared to what it is in a DCF with a step-index inner cladding. The advantage can be understood by virtue of the definition of the LPFG coupling coefficient $\kappa$ given above in relations to Equation 3 and 4. The coupling coefficient is proportional to the spatial overlap of the electric fields of the two coupled modes, calculated over the region of the fiber cross-section where the LPFG periodic index perturbation is applied. In a mechanically induced LPFG, this perturbation spreads across the cross-section of the fiber. In a UV-induced LPFG, this perturbation is typically confined to the core. In both cases, coupling between the $LP_{0q}$ cladding mode and the $LP_{01}$ core mode is stronger when the two modes overlap between. Since the $LP_{01}$ mode energy is mostly located in the fiber core, in a parabolic-profile inner cladding fiber, the $LP_{0q}$ mode is more strongly confines, i.e., it has more energy in the core, and the coupling coefficient $\kappa$ between the $LP_{0q}$ and $LP_{01}$ modes is stronger than it would be in a fiber with a step-index inner cladding.

Thus, shorter LPFGs can be used, and the overall length of the DCF laser or amplifier or broadband light source is shortened. The degree of increase in the LPFG coupling coefficient depends on a number of parameters, such as, for example, the cladding mode number. The degree of increase is particularly significant for low-order modes. As an example, an exemplary fiber has a step-index core with a radius of 7.1 microns and an NA of 0.11, and has an inner cladding with a diameter of 32 microns and an NA of 0.19. Calculations based on the fiber having those parameters show that the $LP_{02} \rightarrow LP_{01}$ coupling coefficient $\kappa_{0201}$ is about 12 times stronger when the inner cladding has a parabolic index profile than when the inner cladding has a step-index profile.

The increased coupling coefficient has beneficial consequences in many applications of LPFGs in addition to the above-described devices made with double-clad fibers. For example, employing a fiber having an inner cladding with a parabolic profile enables a shorter UV-induced LPFG to be uses. Similarly, a shorter mechanically induced LPFG can be used. In addition, the same LPFG can be utilized with a lower index perturbation (with, e.g., lower coupling over the same length). Each of these approaches reduces loss. In addition, employing a fiber having an inner cladding with a parabolic index profile produces stronger grating of the same length.

Thus, the foregoing embodiment can be modified for use with a fiber (with or without double cladding) in which the inner cladding (or the only cladding) has a parabolic profiles. As a result of the increased coupling coefficient, the overall LPFG can be extremely short, about 12 times shorter than a comparable LPFG made in an identical fiber with a step-index cladding. Alternatively, the LPFG may comprise a comparable length but have a weaker index perturbation, which results in a much lower internal loss in the final LPFG.

Although, cladding with a parabolic index profile has been described, other profiles that provide increased confinement or an increased coupling coefficient may be employed. This cladding profile may be higher or peaked closer to the longitudinal axis through the fiber (e.g., at the core/cladding interface). The index in the cladding, such as the inner cladding preferably decreases outward in a radial direction. Similarly, the core may have a peaked index profile other than parabolic that preferably increases confinement and/or the coupling coefficient. This core profile may be higher or peaked closer to the longitudinal axis through the fiber and may decease linearly or non-linearly outward in a radial direction. In addition, such peaked or graded index profiles may be employed with a variety of fiber geometries such as those depicted in FIGS. 2A–2D.

In addition, it should be understood that the LPFGs described herein can be advantageously fabricated on the DCF in a number of ways, such as, for example by applying a mechanical grating structure, by ultraviolet lithography, by melting, by stretching, by densifying, and other ways to change the local refractive index. Corrugated gratings may also be formed by etching away part of the fiber's cladding. Other methods of forming LPFGs, both those well known in the art as well as methods yet to be designed may be employed to produce the grating and the resultant optical effects. Index of refraction features that makeup the grating may be included in the cladding (i.e., inner cladding or the outer cladding) as well as the core. In the case of a photo-induced LPFG fabricated on a photosensitive fiber, the index modulation in the core region is reduced by lowering the ultraviolet (UV) dosage. The lower index modulation results in a lower scattering in the UV-exposed region of the fiber core, and thus a lower propagation loss for the grating. Selecting the right compromise between grating strength and grating length leads to LPFGs and LPFG devices that are shorter and exhibit a lower loss.

As discussed above, certain embodiments in accordance with particular aspects of the present invention include LPFGs having characteristics which couple more than one cladding mode to the core mode. Numerical simulations confirm that embodiments in having such LPFGs do increase the amount of pump power coupled into the core per unit length compared to embodiments that couple only one cladding mode to the core mode. However, modeling also shows that the amount of pump power coupled into the core mode depends on the relative phases of the cladding modes coupled to the core mode, as expected physically. In one example, an LPFG couples both the $LP_{0m}$ and the $LP_{0n}$ cladding modes to the core mode $LP_{01}$. The $LP_{0m}$ and the $LP_{0n}$ cladding modes carry the respective powers $P_m$ and $P_n$. If the two cladding modes are in phase at the input to the LPFG, and if the core mode carries no power, then the power coupled into the core mode at the output of the LPFG will be $P_m+P_n$ (neglecting losses and dopant absorption along the LPFG). On the other hand, if the two cladding modes are out of phase, the power coupled into the core mode will be $|P_m-P_n|$. The absolute phases of all the cladding modes depend strongly on a number of parameters. One parameter is the mode structure of the pump source or pump sources. The mode structure varies constantly over time due to thermal fluctuations in the source or sources. Other parameters include random index perturbations and random length perturbations in the DCF resulting from motions of the fiber, from variations in the temperature of the DCF or from applied stresses. As a result of any of these parameters, a relative phase difference between any two cladding modes varies strongly and rapidly over time. Thus, in certain embodiments, one cladding mode may be preferably coupled to one core mode.

As is well known in the art, multimode DCFs are advantageous in certain applications where a large peak power or continuous-wave power travels in the fiber core. This is especially true of high-power fiber lasers. When the signal intensity in the core (approximately the signal power divided by the core area) is too high, it induces undesirable nonlinear effects that are generally detrimental to the operation of the laser and thus limit the maximum output power that can be generated. The high laser intensity can also induce undesirable thermal effects in the core region, which also limit the maximum achievable output power. One effective method that has been used to reduce these intensity-dependent effects is to increase the core size, which reduces the intensity.

A larger core supports multiple modes. In laser devices utilizing a multimode DCF, embodiments in accordance with aspects of the present invention are advantageously utilized to couple a multiplicity of cladding modes to the core modes. As a result, the overall rate at which pump power is coupled into the core is increased and the device length is reduced. In accordance with such an embodiment, LPFGs are used not only to couple an $LP_{0q}$ mode to the $LP_{01}$ core mode, but also to couple one or more cladding modes to a few or all of the higher order core modes. For example, if the core carries two modes (e.g., the fundamental mode $LP_{01}$ and the first-order mode $LP_{11}$), a first LPFG couples one of the $LP_{0q}$ cladding modes (preferably the $LP_{02}$ mode) to the $LP_{01}$ core mode, and a second LPFG couples one of the $LP_{1q}$ cladding modes (preferably the $LP_{12}$ mode) to the $LP_{11}$ core mode. This coupling is enabled because cladding modes with an azimuthal symmetry other than that of the $LP_{0m}$ modes can effectively be coupled to a core mode with the same azimuthal symmetry. The two coupling processes are independent of the relative phase of the two cladding modes coupled to the core because each one is coupled to a different core mode. Thus, in this situation the phase-induced limitation discussed above does not apply. The net effect of this approach is that the pump power coupled to the core per unit length is increased. The power in the cladding modes is coupled into the core modes in accordance with the foregoing embodiment is $1/(kM)+1/((k+1)M)+\ldots$, where k is the mode group number of the lowest order cladding mode.

One inherent limitation to the just-described method occurs because higher order core modes can only receive energy from a higher order cladding mode, and as explained earlier, higher order cladding modes tend to carry a lower power than lower order cladding modes (see FIG. 10). Consequently, there is a diminishing return to adding more and more LPFGs to couple higher and higher order cladding modes to the core. Consider the case where the $LP_{01}$, $LP_{11}$, $LP_{21}$, and $LP_{02}$ are core modes, the two lowest order core modes $LP_{01}$ and $LP_{11}$ receive their power from the $LP_{03}$ cladding mode and the $LP_{12}$ cladding mode, respectively. (Note that the $LP_{02}$ mode is a core mode in this case). The $LP_{12}$ cladding mode belongs to a mode group with two modes (see FIG. 10), each initially carry the same power of $P_g/2$, as discussed above. However, for the mode ($LP_{21}$), the optimum cladding mode from which it will couple power is the $LP_{22}$ cladding mode. As shown in FIG. 10, the $LP_{22}$ cladding mode belongs to mode group m=6, which includes 3 modes. Therefore, the $LP_{22}$ mode initially carries a power of only $P_g/3$. The $LP_{22}\rightarrow LP_{21}$ LPFG thus couples only $P_g/3$ into the core and is 33% less efficient than the $LP_{12}\rightarrow LP_{11}$ LPFG assuming that optical power is not transferred from the other modes in the group. The coupled power per LPFG is likely to continue to drop as the core mode number increases. It may therefore be more effective to couple to the lowest order core modes. Preferably, the pump power is coupled to the lowest two core modes.

In a large-core multimode fiber, however, the lower order cladding modes (e.g., $LP_{02}$, $LP_{12}$) are core modes. Accordingly coupling the cladding modes to the core modes means that even larger order cladding modes are coupled to the lowest order core modes such as the $LP_{01}$ mode. Although this process may be less efficient for reasons described above, the coupling to a plurality of core mode may offset the inefficiency of coupling from higher order cladding modes.

In certain embodiments, coupling to more than two core modes is advantageous. For example, the coupling length of a particular higher order mode may be shorter than the coupling length of a lower order mode. A method to calculate the dependence of the coupling strength of an LPFG on the mode number can be found, for example, in T. Erdogan, *Cladding-mode resonances in short- and long-period fiber grating filters* (cited above). In a case where the coupling length of a higher order mode is shorter, the corresponding LPFG for coupling the higher order mode is shorter, and the DCF device length is reduced by using the corresponding LPFG.

Coupling to more than two core modes may also be advantageous when multiple LPFGs are combined into a single LPFG with an index perturbation profile equal to the superposition of the index perturbation profiles of corresponding multiple LPFGs. When photo-induced LPFGs are used, this approach is preferably employed for up to a few LPFGs, beyond which the fiber core may not as readily support more index perturbations. In one preferred embodiment in accordance with this aspect of the present invention, an LPFG comprises a superposition of two periods, one to couple the $LP_{02}$ cladding mode to the $LP_{01}$ core mode, and the other one to couple the $LP_{12}$ cladding mode to the $LP_{11}$ core mode. This LPFG has the same length as either an $LP_{02} \rightarrow LP_{01}$ LPFG or an $LP_{12} \rightarrow LP_{11}$ LPFG; however, the total coupled power is doubled.

In another set of embodiments in accordance with aspects of the present invention, bidirectional pumping is incorporated by injecting pump power into the DCF from both directions or by placing a reflector at the far end of the DCF. As described above, one advantage of bidirectional pumping is that pump power also travels from right to left at point A as shown in FIG. 11, which causes pump power to remain to the left of point A. The remaining pump power allows the spacing between LPFGs to be increased, which minimizes the amount of forward pump power coupled out of the core by the LPFG, and which reduces the number of LPFGs required. This method is advantageous for dopants with three-level transitions, such as, for example, the $^4I_{13/2} \rightarrow {}^4I_{15/2}$ transition of $Er^{3+}$. When implementing this concept with unidirectional pumping and a pump reflector, the reflector provides better utilization of the available pump power (by recycling unabsorbed pump power).

Accordingly, coupling light from one or more cladding modes into one or more core modes by employing one or more LPFG may improve fiber lasers and amplifiers. Other methods of providing such coupling without LPFGs may also be utilized.

Although described above in connection with particular embodiments of the present invention, it should be understood that the descriptions of the embodiments are illustrative of the invention and are not intended to be limiting. Various modifications and applications may occur to those skilled in the art without departing from the true spirit and scope of the invention as defined in the appended claims.

What is claimed is:

1. A double-clad optical fiber comprising:
   a core doped with an optically active dopant, the core having a core refractive index;
   an inner cladding surrounding the core, the inner cladding having an inner cladding refractive index, the core refractive index being greater than the inner cladding refractive index, and the core supporting at least one core mode;
   an outer cladding surrounding the inner cladding, the outer cladding having an outer cladding refractive index, the inner cladding refractive index being greater than the outer cladding refractive index, and the inner cladding supporting at least one cladding mode; and
   at least one long-period fiber grating formed in the fiber by a substrate applied against the fiber to perturb the refractive index of at least one of the core and the inner cladding, the long-period fiber grating coupling light from the at least one cladding mode to the at least one core mode.

2. The double-clad optical fiber of claim 1, wherein the core comprises silica.

3. The double-clad optical fiber of claim 1, wherein the long-period fiber grating has a length sufficient to repetitively couple light between the at least one cladding mode and the at least one core mode.

4. The double-clad optical fiber of claim 3, wherein the core is doped with rare-earth ions, the rare-earth ions absorbing a substantial portion of the light coupled to the core mode.

5. The double-clad optical fiber of claim 4, wherein the length of the long-period fiber grating is at least about one centimeter.

6. The double clad optical fiber of claim 1, wherein the core is doped with laser ions.

7. The double clad optical fiber of claim 6, wherein the laser ions comprises one or more rare-earth ion.

8. A double-clad optical fiber comprising:
   an optically active core having a core refractive index;
   an inner cladding surrounding the core, the inner cladding having an inner cladding refractive index, the core refractive index being greater than the inner cladding refractive index, and the core supporting at least one core optical mode;
   an outer cladding surrounding the inner cladding, the outer cladding having an outer cladding refractive index, the inner cladding refractive index being greater than the outer cladding refractive index, and the inner cladding supporting at least one cladding optical mode; and
   a plurality of long-period optical gratings formed in the fiber to couple light from the at least one cladding mode to the at least one core mode, at least one of the long-period optical gratings formed by at least one substrate applied against the fiber to perturb the refractive index of at least one of the core and the inner cladding.

9. The double-clad optical fiber of claim 8, wherein the long-period optical gratings are longitudinally positioned at different locations along a length of the optical fiber.

10. The double-clad optical fiber of claim 9, wherein the long-period optical gratings are spaced apart by selected distances.

11. The double-clad optical fiber of claim 10, wherein a first selected distance between a first long-period optical grating and a second long-period optical grating is substantially equal to a second selected distance between the second long-period optical grating and a third long-period optical grating.

12. A double-clad optical fiber comprising:
an optically active core having a core refractive index;
an inner cladding surrounding the core, the inner cladding having an inner cladding refractive index, the core refractive index being greater than the inner cladding refractive index, and the core supporting at least one core optical mode;
an outer cladding surrounding the inner cladding, the outer cladding having an outer cladding refractive index, the inner cladding refractive index being greater than the outer cladding refractive index, and the inner cladding supporting at least one cladding optical mode; and
a plurality of long-period optical gratings formed in the fiber to couple light from the at least one cladding mode to the at least one core mode, the long-period optical gratings longitudinally positioned at different locations spaced apart by selected distances along a length of the optical fiber, wherein the selected distances between adjacent long-period optical gratings vary along said length of the fiber.

13. The double-clad optical fiber of claim 12, wherein the selected distances between adjacent long-period optical gratings decrease along the length of the fiber.

14. A double-clad optical fiber comprising:
an optically active core having a core refractive index;
an inner cladding surrounding the core, the inner cladding having an inner cladding refractive index, the core refractive index being greater than the inner cladding refractive index, and the core supporting at least one core optical mode;
an outer cladding surrounding the inner cladding, the outer cladding having an outer cladding refractive index, the inner cladding refractive index being greater than the outer cladding refractive index, and the inner cladding supporting at least one cladding optical mode; and
a plurality of long-period optical gratings formed in the fiber to couple light from the at least one cladding mode to the at least one core mode, wherein at least two of the long-period optical gratings are laterally disposed with respect to each other.

15. A double-clad optical fiber comprising:
an optically active core having a core refractive index;
an inner cladding surrounding the core, the inner cladding having an inner cladding refractive index, the core refractive index being greater than the inner cladding refractive index, and the core supporting at least one core optical mode;
an outer cladding surrounding the inner cladding, the outer cladding having an outer cladding refractive index, the inner cladding refractive index being greater than the outer cladding refractive index, and the inner cladding supporting at least one cladding optical mode; and
a plurality of long-period optical gratings formed in the fiber to couple light from the at least one cladding mode to the at least one core mode, wherein at least a first long-period optical grating has a first optical period and at least a second long-period optical grating has a second optical period, wherein the first optical period differs from the second optical period.

16. The double-clad optical fiber of claim 15, wherein the first long-period optical grating and the second long-period optical grating are superimposed.

17. A method of coupling light into a double-clad fiber that comprises an optically active core supporting at least one core mode, an inner cladding supporting at least one inner cladding mode, and an outer cladding, the method comprising:
coupling light into the inner cladding to transfer optical power into an inner cladding mode;
forming a long-period fiber grating by applying a substrate against the fiber to perturb a refractive index of at least one of the core and the inner cladding; and
propagating inner cladding mode light proximate the long-period fiber grating, the long-period fiber grating causing light to be coupled from the inner cladding mode to the core mode to transfer at least a portion of the optical power from the inner cladding to the core, the long-period fiber grating having a period selected to provide phase matching between the inner cladding mode and the core mode to cause the optical power to be coupled between the inner cladding mode and the core mode.

18. The method of claim 17, wherein substantially all the optical power in the inner cladding mode is transferred into the core mode by the long-period fiber grating.

19. The method of claim 17, wherein the at least one inner cladding mode comprises the $LP_{02}$ mode of the inner cladding and wherein the at least one core mode comprises the $LP_{01}$ mode of the core.

20. The method of claim 17, wherein the light is initially coupled into the inner cladding by end firing.

21. The method of claim 20, wherein the light is coupled into the inner cladding via a prism positioned on the outer cladding.

22. The method of claim 20, wherein the light is coupled into the inner cladding via a V groove formed in the inner cladding proximate to the opening in the outer cladding.

23. The method of claim 20, wherein the light is initially coupled into the inner cladding at an end of the fiber.

24. A method of coupling light into a double-clad fiber that comprises an optically active core supporting at least one core mode, an inner cladding supporting at least one inner cladding mode, and an outer cladding, the method comprising:
coupling light into the inner cladding to transfer optical power into an inner cladding mode;
forming a long-period fiber grating by applying a substrate against the fiber to perturb a refractive index of at least one of the core and the inner cladding; and
propagating inner cladding mode light in the effect of long-period fiber grating, the long-period fiber grating causing light to be coupled from the inner cladding mode to the core mode to transfer at least a portion of the optical power from the inner cladding to the core, the long-period fiber grating having a period selected to provide phase matching between the inner cladding mode and the core mode to cause the optical power to be coupled between the inner cladding mode and the core mode.

25. A double-clad optical fiber having a longitudinal axis therethrough, said double-clad optical fiber comprising:
a core doped with an optically active dopant, the core having a core refractive index;

an inner cladding surrounding the core, the inner cladding having an inner cladding refractive index that decreases with lateral distance away from said longitudinal axis, the core refractive index being greater than the inner cladding refractive index, and the core supporting at least one core mode; and an outer cladding surrounding the inner cladding, the outer cladding having an outer cladding refractive index, the inner cladding refractive index being greater than the outer cladding refractive index, and the inner cladding supporting at least one cladding mode; and at least one long-period fiber grating positioned on the fiber to couple light from the at least one cladding mode to the at least one core mode, the long-period fiber grating formed by a substrate applied against the fiber to perturb the refractive index of at least one of the core and the inner cladding.

26. The double-clad optical fiber of claim 25, wherein said inner cladding refractive index decreases non-linearly with lateral distance away from said longitudinal axis.

27. The double-clad optical fiber of claim 26, wherein said inner cladding refractive index decreases with lateral distance away from said longitudinal axis according to a profile having a parabolic dependency of index with lateral distance.

28. The double-clad optical fiber of claim 25, wherein said core refractive index decreases with lateral distance away from said longitudinal axis.

29. The double-clad optical fiber of claim 28, wherein said core refractive index decreases linearly with lateral distance away from said longitudinal axis.

30. The double-clad optical fiber of claim 29, wherein said inner cladding refractive index decreases with lateral distance away from said longitudinal axis according to a profile having a parabolic dependency of index with lateral distance.

31. A double-clad optical fiber system comprising:
a core doped with an optically active dopant, the core having a core refractive index;

an inner cladding surrounding the core, the inner cladding having an inner cladding refractive index, the core refractive index being greater than the inner cladding refractive index, and the core supporting at least one core mode;

an outer cladding surrounding the inner cladding, the outer cladding having an outer cladding refractive index, the inner cladding refractive index being greater than the outer cladding refractive index, and the inner cladding supporting at least one cladding mode;

a substrate applied against the fiber, the substrate producing variations of the refractive index of at least one of the core and the inner cladding; and at least one long-period fiber grating formed in the fiber by the variations, the long-period fiber grating coupling light from the at least one cladding mode to the at least one core mode.

32. A double-clad optical fiber comprising:
a core doped to provide signal gain, the core having a core refractive index;

an inner cladding surrounding the core, the inner cladding having an inner cladding refractive index, the core refractive index being greater than the inner cladding refractive index, and the core supporting at least one core mode;

an outer cladding surrounding the inner cladding, the outer cladding having an outer cladding refractive index, the inner cladding refractive index being greater than the outer cladding refractive index, and the inner cladding supporting at least one cladding mode; and at least one long-period fiber grating formed in the fiber by a substrate applied against the fiber to perturb the refractive index of at least one of the core and the inner cladding, the long-period fiber grating coupling light from the at least one cladding mode to the at least one core mode.

33. The optical fiber of claim 32, wherein the core is doped with rare-earth ions.

34. The optical fiber of claim 32, wherein the core is doped with laser ions.

35. The optical fiber of claim 32, wherein the optical fiber grating comprises a plurality of long-period fiber gratings.

36. The optical fiber of claim 35, wherein the long-period fiber gratings are longitudinally positioned at different locations spaced apart by selected distances along a length of the optical fiber, wherein the selected distances between adjacent long-period fiber gratings vary along the length of the optical fiber.

37. The optical fiber of claim 36, wherein the selected distances between adjacent long-period fiber gratings decrease along the length of the optical fiber.

38. The optical fiber of claim 35, wherein at least two of the long-period fiber gratings are laterally disposed with respect to one another.

39. The optical fiber of claim 35, wherein at least a first long-period fiber grating has a first optical period and at least a second long-period fiber grating has a second optical period different from the first optical period.

40. The optical fiber of claim 39, wherein the first long-period fiber grating and the second long-period fiber grating are superimposed.

41. The optical fiber of claim 32, wherein the optical fiber has a longitudinal axis and the inner cladding refractive index decreases with lateral distance away from the longitudinal axis.

42. The optical fiber of claim 41, wherein the inner cladding refractive index decreases non-linearly with lateral distance away from the longitudinal axis.

43. The optical fiber of claim 32, wherein the optical fiber has a longitudinal axis and the core refractive index decreases with lateral distance away from the longitudinal axis.

* * * * *

UNITED STATES PATENT AND TRADEMARK OFFICE
CERTIFICATE OF CORRECTION

PATENT NO. : 7,064,889 B2
APPLICATION NO. : 10/441152
DATED : June 20, 2006
INVENTOR(S) : Digonnet et al.

It is certified that error appears in the above-identified patent and that said Letters Patent is hereby corrected as shown below:

On the title page item (57),
In column 2 (Abstract), lines 4-5, please delete "rare earth" and insert --rare-earth--, therefor.

On the title page, item (56), page 2,
In column 1 (Other Publications), line 8, please delete "GaA/As" and insert --GaAlAs--, therefor.

On the title page item (56), page 2,
In column 2 (Other Publications), line 1, please delete "charcteristics" and insert --characteristics--, therefor.

In the Drawings:
On sheet 6 of 20, Fig. 6, please delete "Lt" and insert --$L_t$--, therefor.

On sheet 16 of 20, Fig. 15A, please delete ".45" and insert --1.45--, therefor.

On sheet 16 of 20, Fig. 15A, please delete ".445" and insert --1.445--, therefor.

On sheet 18 of 20, Fig. 15C, please delete ".445" and insert --1.445--, therefor.

In column 1, line 5, please delete "large area" and insert --large-area--, therefor.

In column 5, line 1, please delete "rare earth" and insert --rare-earth--, therefor.

In column 8, line 6, please delete "step index" and insert --step-index--, therefor.

In column 8, line 9, please delete "step index" and insert --step-index--, therefor.

In column 9, line 3, please delete "a" and insert --an--, therefor.

In column 11, line 55, please delete "single mode" and insert --single-mode--, therefor.

In column 14, line 40, please delete "single mode" and insert --single-mode--, therefor.

In column 15, line 11, please delete "$LP_{31}$," and insert --$LP_{31}$--, therefor.

UNITED STATES PATENT AND TRADEMARK OFFICE
CERTIFICATE OF CORRECTION

PATENT NO. : 7,064,889 B2
APPLICATION NO. : 10/441152
DATED : June 20, 2006
INVENTOR(S) : Digonnet et al.

It is certified that error appears in the above-identified patent and that said Letters Patent is hereby corrected as shown below:

In column 15, line 46, please delete "rare earth" and insert --rare-earth--, therefor.

In column 16, line 20, please delete "twofold" and insert --two-fold--, therefor.

In column 17, line 31 (approx.), please delete "single mode" and insert --single-mode--, therefor.

In column 18, line 65, please delete "short-and" and insert --short- and--, therefor.

In column 19, line 51, please delete "nth" and insert --$n^{th}$--, therefor.

In column 20, line 24, please delete "undesirable direction)" and insert --undesirable direction))--, therefor.

In column 21, line 64, please delete "$Yb_{3+}$." and insert --$Yb^{3+}$.--, therefor.

In column 23, line 16, please delete "large area" and insert --large-area--, therefor.

In column 27, lines 47-48, please delete "$n_{in}$ is the refractive index of the inner cladding and $n_{in}$ is the refractive index of the inner cladding" and insert --$n_{in}$ is the refractive index of the inner cladding and $n_{out}$ is the refractive index of the outer cladding--, therefor.

In column 32, line 38, in Claim 6, please delete "double clad" and insert --double-clad--, therefor.

In column 32, line 40, in Claim 7, please delete "double clad" and insert --double-clad--, therefor.

UNITED STATES PATENT AND TRADEMARK OFFICE
CERTIFICATE OF CORRECTION

PATENT NO. : 7,064,889 B2
APPLICATION NO. : 10/441152
DATED : June 20, 2006
INVENTOR(S) : Digonnet et al.

It is certified that error appears in the above-identified patent and that said Letters Patent is hereby corrected as shown below:

In column 34, line 53 (approx.), in Claim 24, after "of" please insert --the--.

Signed and Sealed this

Third Day of June, 2008

JON W. DUDAS
*Director of the United States Patent and Trademark Office*